United States Patent
Zhang et al.

(10) Patent No.: US 11,811,324 B2
(45) Date of Patent: Nov. 7, 2023

(54) INTEGRATED CIRCUIT OF A BUCK-BOOST CONVERTER WITH OUTPUT CURRENT SENSING FUNCTION

(71) Applicant: Monolithic Power Systems, Inc., San Jose, CA (US)

(72) Inventors: Jian Zhang, Chengdu (CN); Changjiang Chen, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 70 days.

(21) Appl. No.: 17/530,746

(22) Filed: Nov. 19, 2021

(65) Prior Publication Data
US 2022/0077784 A1 Mar. 10, 2022

Related U.S. Application Data

(63) Continuation-in-part of application No. 16/988,380, filed on Aug. 7, 2020, now Pat. No. 11,329,563.

(51) Int. Cl.
*H02M 3/158* (2006.01)
*H02M 3/157* (2006.01)
*H02M 1/00* (2006.01)

(52) U.S. Cl.
CPC ....... *H02M 3/1582* (2013.01); *H02M 1/0009* (2021.05); *H02M 3/157* (2013.01)

(58) Field of Classification Search
CPC .......................... H02M 3/1582; H02M 1/0009
See application file for complete search history.

(56) References Cited

U.S. PATENT DOCUMENTS

| | | | |
|---|---|---|---|
| 9,966,851 B2 | 5/2018 | Ouyang | |
| 10,075,075 B2 | 9/2018 | Zhang | |
| 10,651,738 B2 | 5/2020 | Gong | |
| 2012/0032658 A1 | 2/2012 | Casey et al. | |
| 2014/0354250 A1 | 12/2014 | Deng | |
| 2015/0069958 A1 | 3/2015 | Yang et al. | |
| 2016/0190931 A1 | 6/2016 | Zhang | |
| 2016/0315535 A1 | 10/2016 | Ouyang | |
| 2017/0187290 A1 | 6/2017 | Li | |
| 2017/0279359 A1 | 9/2017 | Goncalves et al. | |
| 2019/0173370 A1* | 6/2019 | Gong | H02M 3/1582 |
| 2019/0296642 A1* | 9/2019 | Wu | H02M 3/1563 |
| 2020/0076305 A1* | 3/2020 | Pizzotti | H02M 3/1582 |
| 2022/0045613 A1 | 2/2022 | Chen | |

FOREIGN PATENT DOCUMENTS

CN ZL201910001205.4 6/2019

* cited by examiner

*Primary Examiner* — Alex Torres-Rivera
(74) *Attorney, Agent, or Firm* — Perkins Coie LLP

(57) ABSTRACT

An integrated circuit of a buck-boost converter working in a buck mode with a buck power switching cycle, a boost mode with a boost power switching cycle or a buck-boost mode with a buck-boost power switching cycle. The integrated circuit integrates a first power switch, a second power switch, a third power switch and a fourth power switch, and an output current sensing circuit. The buck-boost power switching cycle consists of a first buck-boost phase, a second buck-boost phase and a third buck-boost phase. The output current sensing circuit samples the current flowing through the first power switch during the second buck-boost phase and the current flowing through the fourth power switch during the third buck-boost phase so as to generate the output current information.

20 Claims, 11 Drawing Sheets

INTEGRATED CIRCUIT OF A BUCK-BOOST CONVERTER WITH OUTPUT CURRENT SENSING FUNCTION

CROSS-REFERENCE TO RELATED APPLICATION(S)

This application is a continuation-in-part of U.S. patent application Ser. No. 16/988,380, filed on Aug. 7, 2020 and incorporated herein by reference.

TECHNICAL FIELD

This disclosure relates generally to a buck-boost converter, and more particularly but not exclusively to an output current sensing circuit of the buck-boost converter.

BACKGROUND

Buck-boost converters can convert an input voltage into an output voltage higher than, equal to or lower than the input voltage and can generally provide an output voltage with a wide range. Therefore, buck-boost converters are widely used in power management applications.

Theoretically, a buck-boost converter works in a buck mode when the input voltage is higher than the output voltage, and works in a boost mode when the input voltage is lower than the output voltage, and works in a buck-boost mode when the input voltage is close to the output voltage. However, in practical, the existing buck-boost converter cannot transit smoothly from one mode to another among the buck mode, the boost mode and the buck-boost mode. Therefore, it is desired to provide a buck-boost converter that can transit from one mode to another seamlessly.

In addition, an output current of a buck-boost converter is often needed. Therefore, it is desired to provide an accurate and lossless circuit and method for sensing the output current information of the buck-boost converter.

SUMMARY

In accomplishing the above and other objects, there has been provided an integrated circuit of a buck-boost converter. The buck-boost converter has an inductor externally coupled to the integrated circuit and the inductor has a first terminal and a second terminal. And the buck-boost converter operates in a buck mode with a buck power switching cycle, a boost mode with a boost power switching cycle or a buck-boost mode with a buck-boost power switching cycle. The integrated circuit comprises an input pin, a reference ground pin, a first power switching pin, a second power switching pin and an output pin, a first power switch, a second power switch, a third power switch and a fourth power switch, and an output current sensing circuit. The first power switching pin is coupled to the first terminal of the inductor and the second power switching pin is coupled to the second terminal of the inductor. The first power switch and the second power switch are coupled in series between the input pin and the reference ground pin and form a first common node coupled to the first power switching pin, and the third power switch and the fourth power switch are coupled in series between the output pin and the reference ground pin and form a second common node coupled to the second power switching pin. The output current sensing circuit comprises a first sampling circuit, a second sampling circuit, and a current processing circuit. The first sampling circuit is configured to provide a first sampling current representing a current flowing through the first power switch. The second sampling circuit is configured to provide a second sampling current representing a current flowing through the fourth power switch. The current processing circuit is configured to generate a third sampling current based on the first sampling current and the second sampling current. The buck-boost power switching cycle consists of a first buck-boost phase, a second buck-boost phase and a third buck-boost phase, and the third sampling current equals to zero during the first buck-boost phase, equals to the first sampling current during the second buck-boost phase, and equals to the second sampling current during the third buck-boost phase. The first power switch, the second power switch, the third power switch and the fourth power switch and the output current sensing circuit are formed in the same semiconductor die.

There has also been provided an output current sensing circuit applied in a buck-boost converter. The buck-boost converter has a first power switch, a second power switch, a third power switch and a fourth power switch. The buck-boost converter operates in a buck mode with a buck power switching cycle, a boost mode with a boost power switching cycle or a buck-boost mode with a buck-boost power switching cycle. The output current sensing circuit comprises a first sampling circuit, a second sampling circuit and a current processing circuit. The first sampling circuit is configured to provide a first sampling current representing a current flowing through the first power switch. The second sampling circuit is configured to provide a second sampling current representing a current flowing through the fourth power switch. And the current processing circuit is configured to generate a third sampling current based on the first sampling current and the second sampling current. The buck-boost power switching cycle consists of a first buck-boost phase, a second buck-boost phase and a third buck-boost phase, and the third sampling current equals to zero during the first buck-boost phase, equals to the first sampling current during the second buck-boost phase, and equals to the second sampling current during the third buck-boost phase.

There has also been provided an output current sensing method for sensing an output current information of a buck-boost converter, wherein the buck-boost converter has a first power switch, a second power switch, a third power switch and a fourth power switch, the buck-boost converter operates in a buck mode with a buck power switching cycle, a boost mode with a boost power switching cycle or a buck-boost mode with a buck-boost power switching cycle, the output current sensing method comprising: generating a first sampling current representing a current flowing through the first power switch; generating a second sampling current representing a current flowing through the fourth power switch; generating a third sampling current based on the first sampling current and the second sampling current; and generating output current information based on the third sampling current; wherein the buck-boost power switching cycle consists of a first buck-boost phase, a second buck-boost phase and a third buck-boost phase, and the step of generating the third sampling current comprises sampling the first sampling current to generate the third sampling current during the second buck-boost phase and sampling the second sampling current to generate the third sampling current during the third buck-boost phase and the third sampling current equals to zero during the first buck-boost phase.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
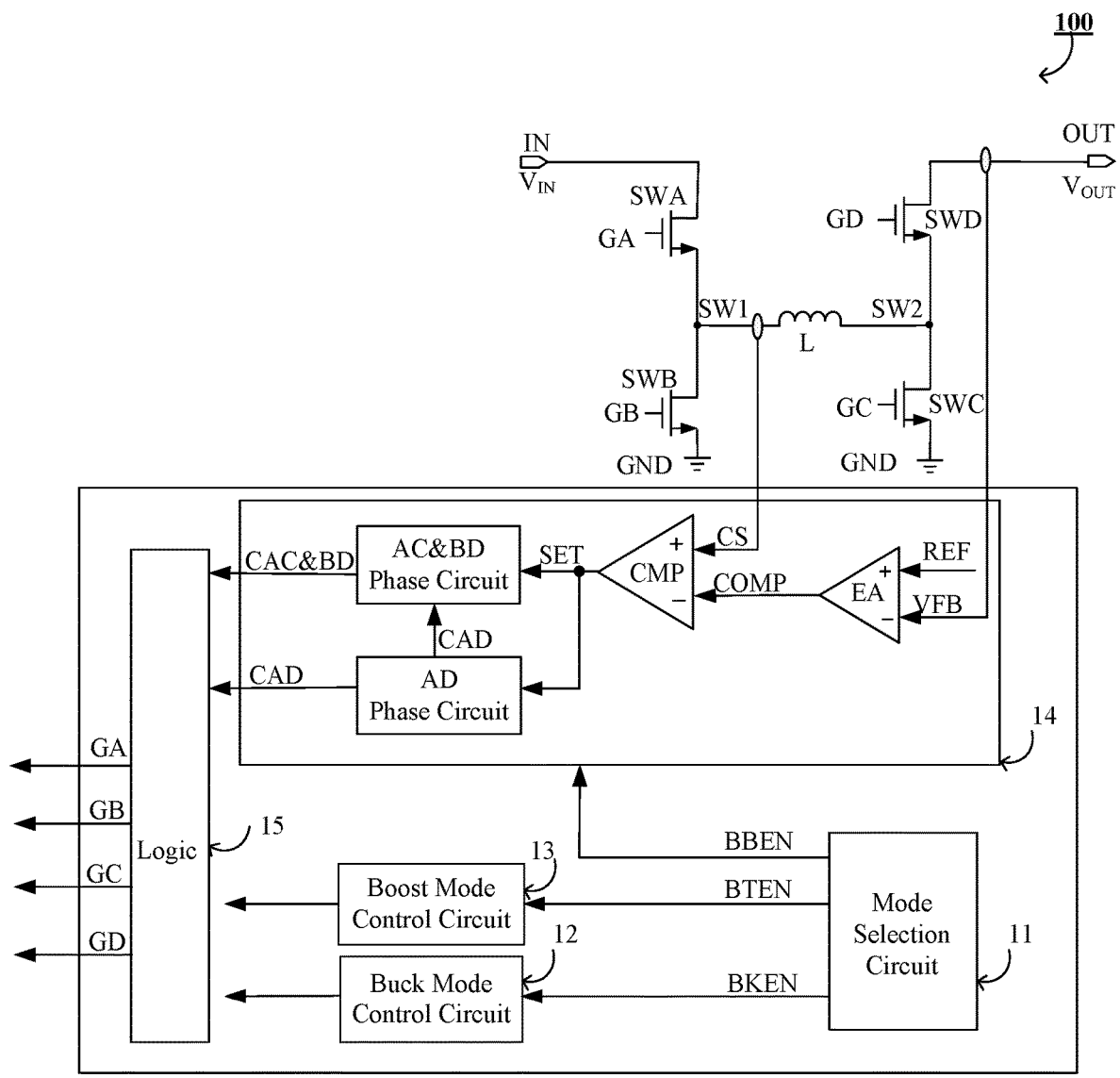
FIG. 1 illustrates a schematic diagram of a buck-boost converter 100 in accordance with an embodiment of the present invention.

FIG. 1 illustrates a schematic diagram of a buck-boost converter 100 in accordance with an embodiment of the present invention. The buck-boost converter 100 comprises an inductor L and a power switch module having a first power switch SWA, a second power switch SWB, a third power switch SWC and a fourth power SWD. The first power switch SWA and the second power switch SWB are coupled in series between an input terminal IN and a reference ground GND, and have a common connection SW1 referred to as a first common node SW1, the third power switch SWC and the fourth power switch SWD are coupled in series between an output terminal OUT and the reference ground GND, and have a common connection SW2 referred to as a second common node SW2. The inductor L is coupled between the first common node SW1 and the second common node SW2. The buck-boost converter 100 further comprises a control circuit to provide a first driving signal GA, a second driving signal GB, a third driving signal GC and a fourth driving signal GD respectively to control the on and off of the power switches SWA, SWB, SWC and SWD so as to convert an input voltage $V_{IN}$ received at the input terminal IN to an appropriate output voltage $V_{OUT}$ at the output terminal OUT. The buck-boost converter 100 works in a buck mode, a boost mode or a buck-boost mode according to the values of the input voltage $V_{IN}$ and the output voltage $V_{OUT}$.

Referring to FIG. 1, the control circuit comprises a mode selection circuit 11, a buck mode control circuit 12, a boost mode control circuit 13, a buck-boost mode control circuit 14 and a logic circuit 15. The mode selection circuit 11 provides a buck mode enable signal BKEN, a boost mode enable signal BTEN and a buck-boost mode enable signal BBEN to control the buck-boost converter 100 to work in the buck mode, the boost mode or the buck-boost mode respectively. When the buck-boost converter 100 works in the buck mode, the third power switch SWC is maintained at the off state and the fourth power switch SWD is maintained at the on state, while the first power switch SWA and the second power switch SWB are controlled to conduct on and off power switching complementarily, i.e., when the first power switch SWA is power switched on, the second power switch SWB is power switched off, and vice versa. In the buck mode, the power switch module is regulated to operate in turn power switching cycle by power switching cycle, wherein the power switching cycle during which the first power switch SWA and the second power switch SWB are operated to conduct on and off power switching is referred to as a buck power switching cycle. Thus during each of the buck power switching cycles, when the first power switch SWA is power switched on and the second power switch SWB is power switched off, the first power switch SWA and the fourth power switch SWD are actually on, and this situation is referred to as an AD phase in the present invention, and when the first power switch SWA is power switched off and the second power switch SWB is power switched on, the second power switch SWB and the fourth power switch SWD are actually on, and this situation is referred to as a BD phase in the present invention. Each of the buck power switching cycles comprises the AD phase during which both of the first power switch SWA and the fourth power switch SWD are in the on state and the BD phase during which both of the second power switch SWB and the fourth power switch SWD are in the on state. Thus, the time period of the buck power switching cycle TBK is the sum of the time period of the AD phase TAD and the time period of the BD phase TBD, i.e., TBK=TAD+TBD. When the buck-boost converter 100 works in the buck mode, a fraction of the AD phase to one entire buck power switching cycle is referred to as a buck duty cycle $D_{BK}$ which is determined by the input voltage $V_{IN}$ and the output voltage $V_{OUT}$. In one embodiment, the buck-boost converter 100 has a buck duty threshold $D_{BKTH}$ which is configured to limit the buck duty cycle $D_{BK}$ in the buck power switching cycles. In one embodiment, the buck duty threshold $D_{BKTH}$ is set to be a value of 85%, 90% or 95%. In another embodiment, the buck duty threshold DB KTH may be set to be values of other percentage.

When the buck-boost converter 100 is controlled to work in the boost mode, the first power switch SWA is maintained at the on state, the second power switch SWB is maintained at the off state, while the third power switch SWC and the fourth power switch SWD are controlled to conduct on and off power switching complementarily, i.e., when the third power switch SWC is power switched on, the fourth power switch SWD is power switched off and vice versa. In the boost mode, the power switch module is regulated to operate in turn power switching cycle by power switching cycle, wherein a power switching cycle during which the third power switch SWC and the fourth power switch SWD are operated to conduct on and off power switching is referred to as a boost power switching cycle. Thus during each of the boost power switching cycles, when the third power switch SWC is power switched on and the fourth power switch SWD is power switched off, the first power switch SWA and the third power switch SWC are actually on, and this situation is referred to as a AC phase in the present invention, and when the third power switch SWC is power switched off and the fourth power switch SWD is power switched on, the first power switch SWA and the fourth power switch SWD are actually on, and this situation is referred to as the AD phase in the present invention. Each of the boost power switching cycles comprises the AC phase during which the first power switch SWA and the third power switch SWC are in the on state and the AD phase during which the first power switch SWA and the fourth power switch SWD are in the on state. Thus, the time period of the boost power switching cycle TBT is the sum of the time period of the AC phase TAC and the time period of the AD phase TAD, i.e., TBT=TAC+TAD. When the buck-boost converter 100 works in the boost mode, a fraction of the AC phase to one entire boost power switching cycle is referred to as a boost duty cycle $D_{BT}$ which is also determined by the input voltage $V_{IN}$ and the output voltage $V_{OUT}$. In one embodiment, the buck-boost converter 100 has a boost duty threshold $D_{BTTH}$ which is configured to limit the boost duty cycle $D_{BT}$. In one embodiment, the boost duty threshold $D_{BTTH}$ is set to be a value of 5%, 10% or 15%. In another embodiment, the boost duty threshold $D_{BTTH}$ may be set to be values of other percentage. The time period of the boost power switching cycle TBT equals the time period of the buck power switching cycle TBK.

When the buck-boost converter 100 works in the buck-boost mode, the power switch module is regulated to operate with buck-boost power switching cycles continuously, wherein each of the buck-boost power switching cycles comprises the AC phase during which the first power switch SWA and the third power switch SWC are in the on state while the second power switch SWB and the fourth power switch SWD are in the off state, the AD phase during which the first power switch SWA and the fourth power switch SWD are in the on state while the second power switch SWB and the third power switch SWC are in the off state, and the BD phase during which the second power switch SWB and the fourth power switch SWD are in the on state while the first power switch SWA and the third power switch SWC are in the off state. Thus, the time period of the buck-boost power switching cycle TBB is the sum of the time period of the AC phase TAC, the time period of the AD phase TAD and the time period of the BD phase TBD, i.e., TBB=TAC+TAD+TBD. In the buck-boost mode, a fraction of the AC phase to one entire buck-boost power switching cycle is referred to as a duty cycle of the AC phase $D_{AC}$, a fraction of the AD phase to one entire buck-boost power switching cycle is referred to as an duty cycle of the AD phase $D_{AD}$, and a fraction of the BD phase to one entire buck-boost power switching cycle is referred to as a duty cycle of the BD phase $D_{BD}$, thus for each of the buck-boost power switching cycles, $D_{AC}+D_{AD}+D_{BD}=100\%$. In one embodiment, the duty cycle of the AC phase $D_{AC}$ is controlled and determined by a reference signal REF, a feedback signal VFB indicative of the output voltage $V_{OUT}$, and an inductor current sense signal CS indicative of a current flowing through the inductor L, wherein the duty cycle of the AD phase $D_{AD}$ is controlled and maintained at a preset duty threshold $D_{ON1}$ which is less than the buck duty threshold $D_{BKTH}$, wherein the time periods of the buck power switching cycle, the boost power switching cycle and the buck-boost power switching cycle are all equal, i.e., TBB=TBK=TBT.

Referring to FIG. 1, the buck mode control circuit 12 may comprise a constant on time control mode, a constant off time control mode or a peak current pulse width modulation control mode. Considering the constant on time control mode, the constant off time control mode and the peak current pulse width modulation control mode are all routine techniques for one person with ordinary skill in this art, so the working principles are not described here for simplicity. Similarly, the boost mode control circuit 13 may also comprise the constant on time control mode, the constant off time control mode or the peak current pulse width modulation control mode.

Referring still to FIG. 1, the buck-boost mode control circuit 14 comprises an AC phase circuit, an AD phase circuit and a cycle period circuit. The AC phase circuit comprises an error amplifier EA and a comparator CMP, the error amplifier EA is configured to receive the reference signal REF and the feedback signal VFB and configured to generate a compensation signal COMP based on the reference signal REF and the feedback signal VFB. The comparator CMP is configured to compare the inductor current sense signal CS and the compensation signal COMP, and configured to generate a setting signal SET to control the duty cycle of the AC phase $D_{AC}$ based on the inductor current sense signal CS and the compensation signal COMP. The setting signal SET transits from a first state to a second state to terminate the AC phase when the inductor current sense signal CS is increased to reach the compensation signal COMP. The AD phase circuit is configured to control the power switch module to work in the AD phase based on the setting signal SET, and further configured to generate an AD phase control signal CAD to control and maintain the duty cycle of the AD phase $D_{AD}$ at the preset duty threshold Dom. The cycle period circuit is coupled to the AC phase circuit and the AD phase circuit to receive the setting signal SET and the AD phase control signal CAD, and configured to generate a cycle period control signal CAC&BD to control the time period of the buck-boost power switching cycle.

Figure 2:
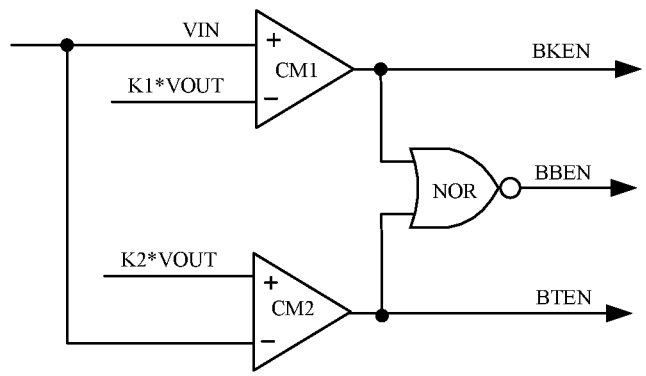
FIG. 2 illustrates a schematic diagram of a mode selection circuit 11 shown in FIG. 1 in accordance with an embodiment of the present invention.

FIG. 2 illustrates a circuit block diagram of a mode selection circuit 11 in accordance with an embodiment of the present invention. The mode selection circuit 11 comprises a buck comparator CM1, a boost comparator CM2 and a NOR gate. The buck comparator CM1 has a first input terminal configured to receive the input voltage $V_{IN}$, a second input terminal configured to receive the output voltage $V_{OUT}$ by a first threshold K1, and an output terminal to provide the buck mode enable signal BKEN. When the input voltage $V_{IN}$ is higher than the output voltage $V_{OUT}$ by the first threshold K1, the mode selection circuit 11 is configured to provide the buck mode enable signal BKEN to control the buck-boost converter 100 to work in the buck mode, wherein the first threshold K1 is a constant higher than 1. The boost comparator CM2 has a first input terminal configured to receive the input voltage $V_{IN}$, a second input terminal configured to receive the output voltage $V_{OUT}$ by a second threshold K2, and an output terminal to provide the boost mode enable signal BTEN. When the input voltage $V_{IN}$ is less than the output voltage $V_{OUT}$ by the second threshold K2, the mode selection circuit 11 is configured to provide the boost mode enable signal BTEN to control the buck-boost converter 100 to work in the boost mode, wherein the second threshold K2 is a constant less than 1 and higher than 0. The NOR gate has a first input terminal configured to receive the buck mode enable signal BKEN, a second input terminal configured to receive the boost mode enable signal BTEN, and an output terminal to provide the buck-boost mode enable signal BBEN. When the input voltage $V_{IN}$ is less than the output voltage $V_{OUT}$ by the first threshold K1 and higher than the output voltage $V_{OUT}$ by the second threshold K2, the mode selection circuit 11 is configured to provide the buck-boost mode enable signal BBEN to control the buck-boost converter 100 to work in the buck-boost mode.

The mode selection circuit 11 shown in FIG. 2 is configured to provide the buck mode enable signal BKEN, the boost mode enable signal BTEN and the buck-boost mode enable signal BBEN by comparing the input voltage $V_{IN}$ with the output voltage $V_{OUT}$. In other embodiments, the mode selection circuit 11 may configure to generated the buck mode enable signal BKEN, the boost mode enable signal BTEN and the buck-boost mode enable signal BBEN by detecting the buck duty cycle $D_{BK}$ and the boost duty cycle $D_{BT}$. The mode selection circuit 11 comprises a buck duty cycle sensing and comparison circuit and a boost duty cycle sensing and comparison circuit. The buck duty cycle sensing and comparison circuit is configured to sense the buck duty cycle $D_{BK}$ of the buck-boost converter 100 and to compare the buck duty cycle $D_{BK}$ with the buck duty threshold $D_{BKTH}$, wherein when the buck duty cycle $D_{BK}$ is higher than the buck duty threshold $D_{BKTH}$, the buck-boost converter 100 is regulated to transit from the buck mode to the buck-boost mode. The boost duty cycle sensing and comparison circuit is configured to sense the boost duty cycle $D_{BT}$ of the buck-boost converter 100 and to compare the boost duty cycle $D_{BT}$ with the boost duty threshold $D_{BTTH}$, wherein when the boost duty cycle $D_{BT}$ is less than the boost duty threshold $D_{BTTH}$, the buck-boost converter 100 is regulated to transit from the boost mode to the buck-boost mode.

Figure 3A:
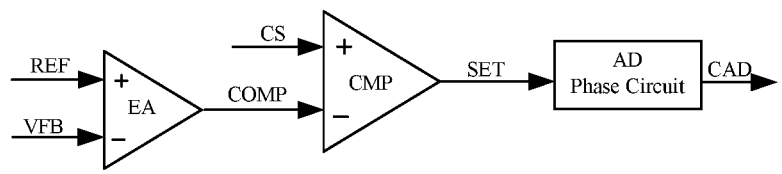
FIG. 3A illustrates a schematic diagram of a buck-boost mode control circuit 14 shown in FIG. 1 in accordance with an embodiment of the present invention.
Figure 3A:
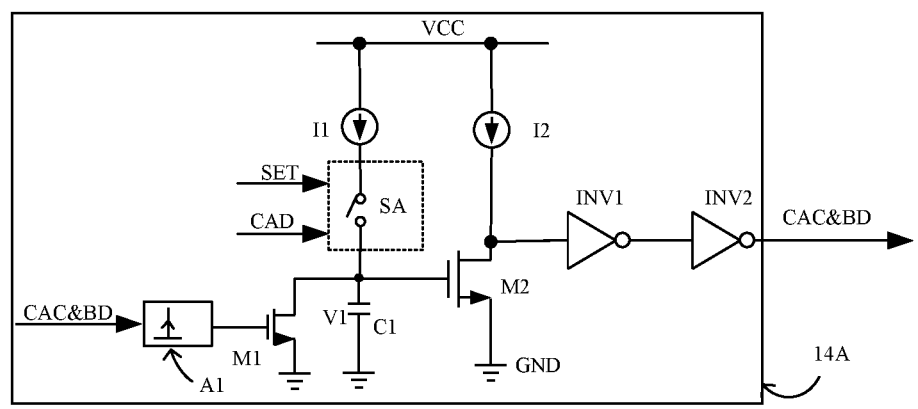

FIG. 3A illustrates a schematic diagram of a buck-boost mode control circuit 14 shown in FIG. 1 in accordance with an embodiment of the present invention. The buck-boost mode control circuit 14 comprises the AC phase circuit, the AD phase circuit and the cycle period circuit. The AC phase circuit comprises the error amplifier EA and the comparator CMP, the error amplifier EA is configured to receive the reference signal REF and the feedback signal VFB and configured to generate the compensation signal COMP based on the reference signal REF and the feedback signal VFB. The comparator CMP is configured to compare the inductor current sense signal CS with the compensation signal COMP, and configured to generate the setting signal SET to control the duty cycle of the AC phase $D_{AC}$ based on the setting signal SET and the compensation signal COMP. The error amplifier EA has a first input terminal to receive the reference signal REF, a second input terminal to receive the feedback signal VFB, the error amplifier EA amplifies the error between the feedback signal VFB and the inductor current sense signal CS. The comparator CMP has s first input terminal to receive the inductor current sense signal CS, a second input terminal to receive the compensation signal COMP, the comparator CMP compares the inductor current sense signal CS with the compensation signal COMP, and when the inductor current sense signal CS is increased to reach the compensation signal COMP, the setting signal SET transits from a first state to a second state to terminate the AC phase. The time period of the AD phase is determined by the time period of the setting signal SET maintained at the first state, thus the duty cycle of the AD phase $D_{AD}$ is also determined by the setting signal SET.

The cycle period circuit 14A is configured to provide a cycle period control signal CAC&BD to control the period time of the buck-boost power switching cycle to be equal to the period time of the buck power switching cycle and the period time of the boost power switching cycle. In FIG. 3A, the cycle period circuit 14A comprises a first current source I1, a switch SA, a capacitor C1, a transistor M1, a second current source I2, a transistor M2, a first inverter INV2, a second inverter INV2 and a trigger A1 which are connected as shown in FIG. 3A. The first current source I1, the switch SA and the capacitor C1 are coupled in series between a supply voltage VCC and a reference ground GND. The first current source I1 has a first terminal coupled to the supply voltage VCC, and a second terminal. The switch SA has a first terminal coupled to the second terminal of the first current source I1, and a second terminal. The capacitor C1 has a first terminal coupled to the second terminal of the switch SA and a second terminal coupled to the reference ground GND. The transistor M1 has a first terminal coupled to the first terminal of the capacitor C1, a second terminal coupled to the reference ground GND, and a control terminal. The second current source I2 has a first terminal coupled to the supply voltage VCC, and a second terminal. The transistor M2 has a first terminal coupled to the second terminal of the second current source I2, a second terminal coupled to the reference ground GND and a control terminal coupled to the first terminal of the capacitor C1. The first inverter INV1 has an input terminal coupled to the first terminal of the transistor M2, and an output terminal. The second inverter INV2 has an input terminal coupled to the output terminal of the first inverter INV1, and an output terminal to provide the cycle period control signal CAC&BD. The trigger A1 is configured to provide a pulse signal to the control terminal of the transistor M1 based on the cycle period control signal CAC&BD. The working principle of the cycle period control circuit is: the switch SA is controlled to turn on by the setting signal SET during the AC phase of the buck-boost power switching cycle, the first current source I1 charges the capacitor C1 and the capacitor C1 has a first voltage V1 which is increased from zero with the charging. The first current source I1 keeps on charging until the AC phase is end, and the AD phase circuit is enabled. The switch SA is controlled to turn off once the AC phase is end. The switch SA is controlled and maintained at the off state until the AD phase is end and is controlled to turn on again. The switch SA turns on and the first current source I1 continues to charge the first capacitor C1 until the first voltage V1 is increased to reach the threshold voltage VTH of the transistor M2. The cycle period control signal CAC&BD transits from a first state to a second state to end one buck-boost power switching cycle, and the time period of the buck-boost power switching cycle is determined by the time period of the cycle period control signal CAC&BD maintained at the first state.

In other embodiments, the cycle period control circuit may comprise other structural topologic, any structural topologic that can generate the cycle period control signal CAC&BD to control the time period of the buck-boost power switching cycle equal to the time period of the buck power switching cycle and the time period of the boost power switching cycle is suitable.

Figure 3B:
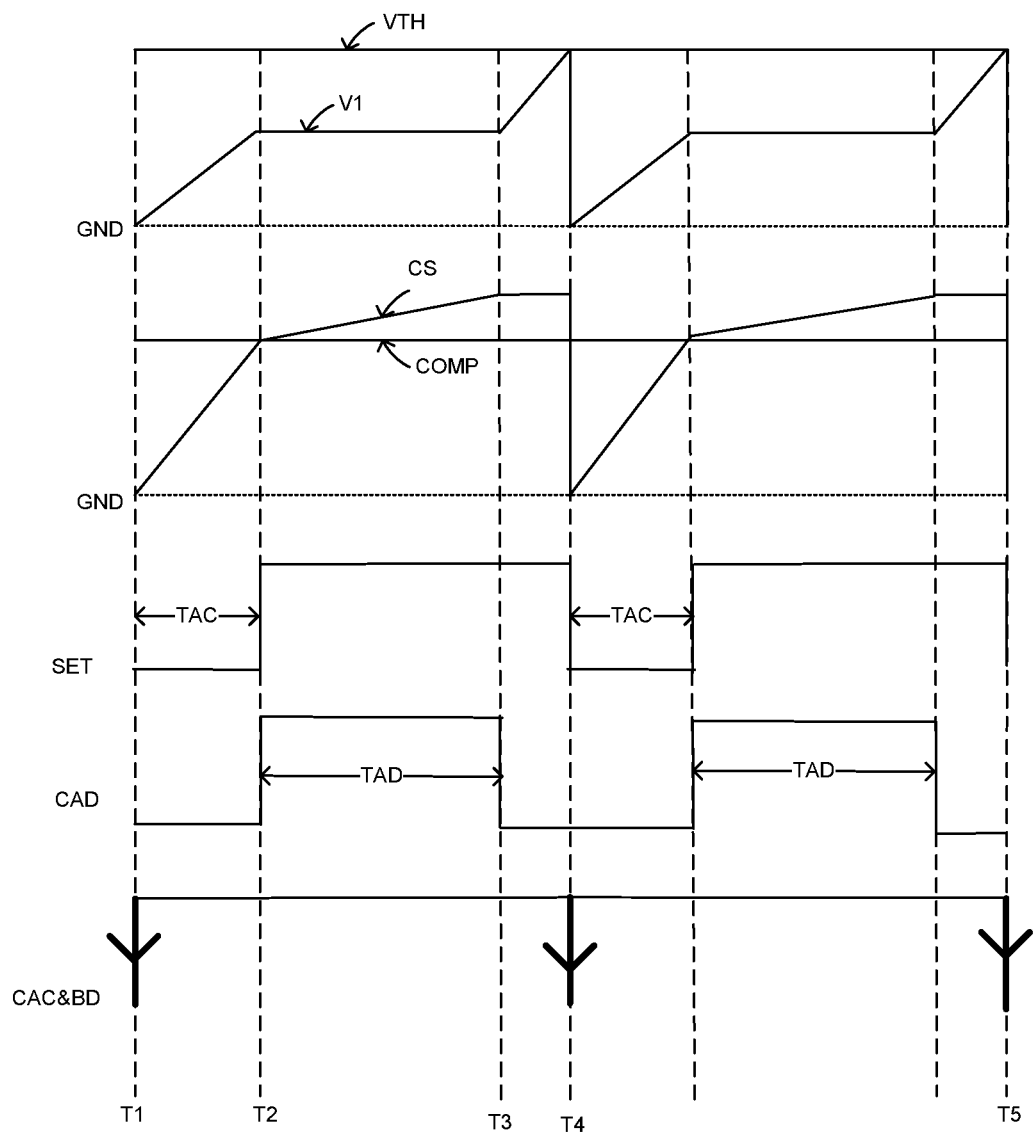
FIG. 3B illustrates an operating waveform diagram of the buck-boost mode control circuit 14 shown in FIG. 3A in accordance with an embodiment of the present invention.

FIG. 3B illustrates the waveform diagram of the buck-boost mode control circuit 14 shown in FIG. 3A in accordance with an embodiment of the present invention. In FIG. 3B, the falling edge of the cycle period control signal CAC&BD comes at the moment T1, and the transistor M1 is turned on for a very short time at the trigger of the falling edge of the cycle period control signal CAC&BD, thus the first voltage V1 on the capacitor C1 is discharged to zero quickly and a buck-boost power switching cycle starts. The transistor M1 is turned off once the first voltage V1 is discharged to zero. At the moment T1, the inductor current sense signal CS is less than the compensation signal COMP and the inductor current sense signal CS is increased to reach the compensation signal COMP at the moment T2, so the setting signal SET transits from the first state of logic low to the second state of logic high to terminate the AC phase at the moment T2, and the time period of the AC phase TAC is determined by the time period when the setting signal SET is maintained at the first state. The AD phase control signal CAD transits from a first state of logic low to a second state of logic high at the trigger of the rising edge of the setting signal SET. The AD phase control signal CAD is maintained at the second state of logic high for a period time equal to $D_{ON1}*TBB$ to control the time period of the AD phase. The switch SA is controlled to turn on by the setting signal SET during the period from the moment T1 to the moment T2 and controlled to turn off during the time period from the moment T2 to the moment T3 by the AD phase control signal CAD, so the first voltage V1 increases during the period from the moment T1 to the moment T2 and keeps constant during the period from the moment T2 to the moment T3. At the moment T3, the AD phase control signal CAD transits from the second state of logic high to the first state of logic low to terminate the AD phase and the switch SA is controlled turned on again. The first current source I1 starts to charge the capacitor C1 from the moment T3 and keeps on charging until the moment T4 for the first voltage V1 is increased to reach the threshold voltage VTH of the transistor M2 and the transistor M2 is controlled to turn on which cause the falling edge of the cycle period control signal CAC&BD comes. At the moment T4, the transistor M1 is turned on again at the trigger of the falling edge of the cycle period control signal CAC&BD, thus the first voltage V1 on the capacitor C1 is discharged to zero again and a next buck-boost power switching cycle from the moment T4 to the moment T5 starts.

Figure 4:
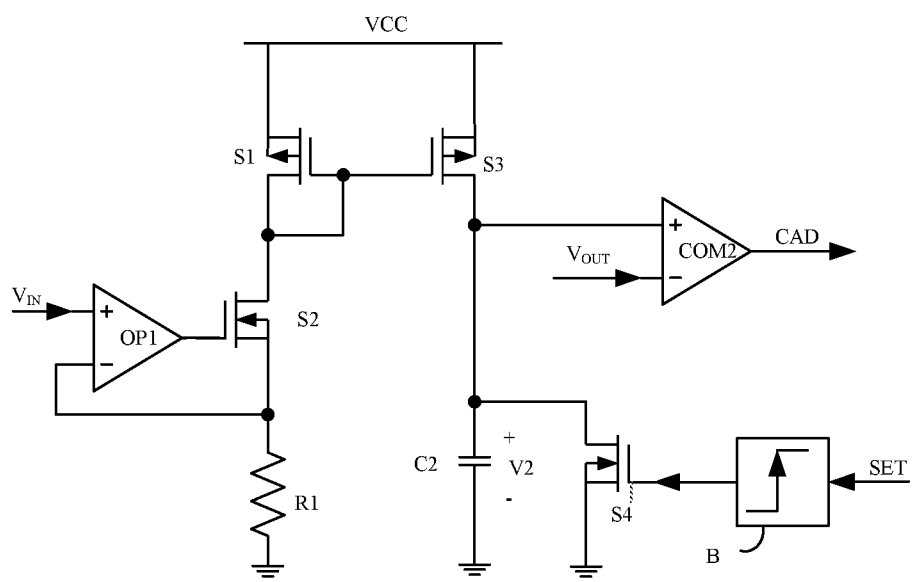
FIG. 4 illustrate a schematic diagram of an AD phase circuit in accordance with an embodiment of the present invention.

FIG. 4 illustrate a block diagram of the AD phase circuit shown in FIG. 3A in accordance with an embodiment of the present invention. The AD phase circuit is configured to provide the AD phase control signal CAD to control and maintain the duty cycle of the AD phase $D_{AD}$ at a preset duty threshold $D_{ON1}$, the preset duty threshold $D_{ON1}$ is smaller than the buck duty threshold $D_{BKTH}$. In FIG. 4, the AD phase circuit comprises a transistor S1, a resistor R1, a transistor S2, a transistor S3, an operational amplifier OP1, a capacitor C2, a transistor S4, a trigger B and a comparator COM2 which are connected as FIG. 4 shown. The transistor S1 has a first terminal coupled to the supply voltage VCC, a second terminal and a gate terminal, wherein the gate terminal is coupled to the second terminal of the transistor S1. The transistor S2 has a first terminal coupled to the second terminal of the transistor S1, a second terminal and a control terminal. The resistor R1 has a first terminal coupled to the second terminal of the transistor S2, and a second terminal coupled to the reference ground GND. The transistor S3 has a first terminal coupled to the supply voltage VCC, a gate terminal coupled to the gate terminal of the transistor S1, and a second terminal. The operational amplifier OP1 has a first input terminal to receive the input voltage $V_{IN}$, a second input terminal coupled to the source terminal of the transistor S2, and an output terminal coupled to the control terminal of the transistor S2. The capacitor C2 has a first terminal coupled to the second terminal of the transistor S3, and a second terminal coupled to the reference ground GND. The transistor S4 has a first terminal coupled to the second terminal of the transistor S3, a second terminal coupled to the reference ground GND, and a control terminal. The trigger B is configured to provide a pulse signal to the control terminal of the transistor S4 based on the setting signal SET. The comparator COM2 has a first input terminal coupled to the second terminal of the transistor S3, a second input terminal to receive the output voltage $V_{OUT}$, and an output terminal to provide the AD phase control signal CAD.

Figure 5:
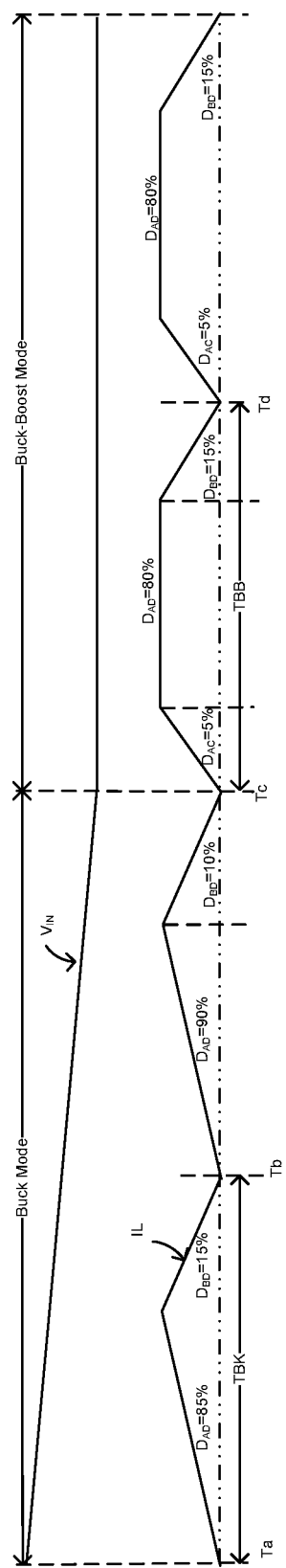
FIG. 5 illustrates waveform diagrams of an inductor current IL flowing through the inductor L of the buck-boost converter 100 as well as the input voltage $V_{IN}$ when the buck-boost converter 100 transits from the buck mode to the buck-boost mode in accordance with an embodiment of the present invention.

FIG. 5 illustrates waveform diagrams of an inductor current IL flowing through the inductor L of the buck-boost converter 100 as well as the input voltage $V_{IN}$ when the buck-boost converter 100 transits from the buck mode to the buck-boost mode in accordance with an embodiment of the present invention. In FIG. 5, the buck duty threshold $D_{BKTH}$ is set to be a value of 90%. The buck-boost converter 100 works in the buck mode with the buck power switching cycles continuously during the period from the moment Ta to the moment Tc. Each of the buck power switching cycles comprises the AD phase during which both of the first power switch SWA and the fourth power switch SWD are in the on state and the BD phase during which both of the second power switch SWB and the fourth power switch SWD are in the on state. The buck duty cycle $D_{BK}$ is increased from 85% in the first buck power switching cycle (from the moment Ta to the moment Tb) to 90% in the second buck power switching cycle (from the moment Tb to the moment Tb) with the decrease of the input voltage $V_{IN}$. Thus the buck duty cycle $D_{BK}$ is increased to reach the buck duty threshold $D_{BKTH}$, so the buck-boost converter 100 is required to transit from the buck mode with the buck power switching cycles to the buck-boost mode with the buck-boost power switching cycles. Compared to the buck power switching cycles, each of the buck-boost power switching cycles further comprises the AC phase during which the first power switch SWA and the third power switch SWC are in the on state. In each of the buck-boost power switching cycles, the duty cycle of the AC phase $D_{AC}$ is determined by the reference signal REF, the feedback signal FB indicative of the output voltage $V_{OUT}$ and the inductor current sense signal CS. In FIG. 5, the duty cycle of the AC phase $D_{AC}$ is controlled to be 5%. It can be seen from FIG. 5 that the duty cycle of the AD phase $D_{AD}$ is decreased from 90% to the preset duty threshold $D_{ON1}$=80% with a buck duty hysteresis having a value of 10% when the buck-boost converter 100 is controlled to transit from the buck mode with the buck power switching cycles to the buck-boost mode with the buck-boost power switching cycles. The duty cycle of the AD phase $D_{AD}$ is controlled and maintained at the preset duty threshold $D_{ON1}$ during the following buck-boost power switching cycles and the time period of the buck-boost power switching cycle TBB equals the time period of the buck power switching cycle TBK.

Figure 6:
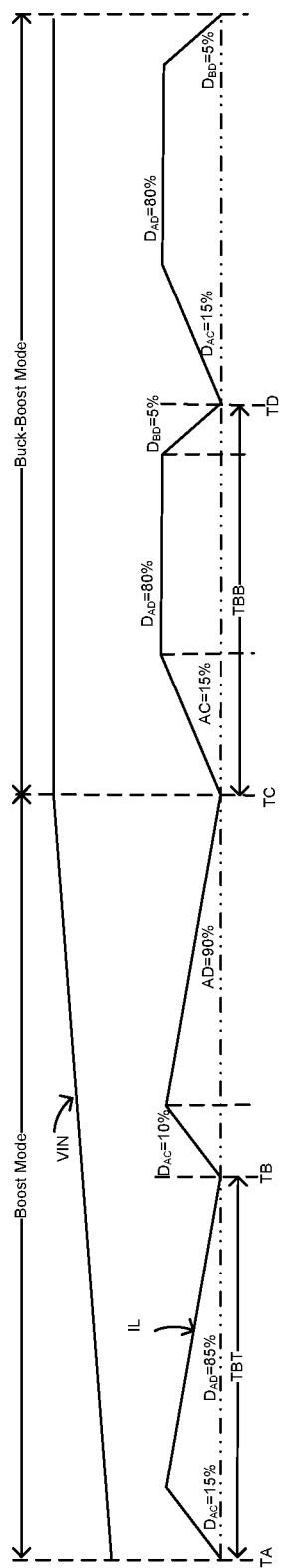
FIG. 6 illustrates waveform diagrams of an inductor current IL flowing through the inductor L of the buck-boost converter 100 as well as the input voltage $V_{IN}$ when the buck-boost converter 100 transits from the boost mode to the buck-boost mode in accordance with an embodiment of the present invention.

FIG. 6 illustrates waveform diagrams of an inductor current IL flowing through the inductor L of the buck-boost converter 100 as well as the input voltage $V_{IN}$ when the buck-boost converter 100 transits from the boost mode to the buck-boost mode in accordance with an embodiment of the present invention. In FIG. 6, the boost duty threshold $D_{BTTH}$ is set to be a value of 10%. The buck-boost converter 100 works in the boost mode with the boost power switching cycles continuously during the period from the moment TA to the moment TC. Each of the boost power switching cycles comprises the AC phase during which both of the first power switch SWA and the third power switch SWC are in the on state and the AD phase during which both of the first power switch SWA and the fourth power switch SWD are in the on state. The boost duty cycle $D_{BT}$ is decreased from 15% in the first boost power switching cycle (from the moment TA to the moment TB) to 10% in the second boost power switching cycle (from the moment TB to the moment TC) with the increase of the input voltage $V_{IN}$. Thus the boost duty cycle $D_{BT}$ is decreased to reach the boost duty threshold $D_{BTTH}$, so the buck-boost converter 100 is required to transit from the boost mode with the boost power switching cycles to the buck-boost mode with the buck-boost power switching cycles. Compared to the boost power switching cycles, each of the buck-boost power switching cycles further comprises the BD phase during which the second power switch SWB and the fourth power switch SWD are in the on state. In each of the buck-boost power switching cycles, the duty cycle of the AC phase $D_{AC}$ is determined by the reference signal REF, the feedback signal FB indicative of the output voltage $V_{OUT}$ and the inductor current sense signal CS. In FIG. 6, the duty cycle of the AC phase $D_{AC}$ in each of the buck-boost power switching cycles is controlled to be 15%. It can be seen from FIG. 6 that the duty cycle of the AD phase $D_{AD}$ is decreased from 90% to the preset duty threshold $D_{ON1}$=80% with a boost duty hysteresis having a value of 10% when the buck-boost converter 100 is controlled to transit from the boost mode to the buck-boost mode. The duty cycle of the AD phase $D_{AD}$ is controlled and maintained at the preset duty threshold $D_{ON1}$ during the following buck-boost power switching cycles and the time period of the buck-boost power switching cycle TBB equals the time period of the boost power switching cycle TBT.

One of ordinary skill should know that, the duty cycle of the phase AD $D_{AD}$ is controlled and maintained at the preset duty threshold $D_{ON1}$ during each of the buck-boost power switching cycles, wherein the preset duty threshold $D_{ON1}$ is set to be 80% in the embodiment shown in FIG. 5. And of course, this is just to provide an example and is not intended to be limiting, may be set to be other suitable duty cycle values in other embodiments.

One of ordinary skill in the art should know that although the buck-boost converter 100 in FIG. 5 and FIG. 6 is controlled to work in one of the buck mode, boost mode or buck-boost mode by detecting the buck duty cycle $D_{BK}$ and the boost duty cycle $D_{BT}$. In other embodiments, the buck-boost converter 100 is controlled to work in the buck mode, the boost mode or the buck-boost mode by detecting the input voltage VIN and the output voltage $V_{OUT}$.

A method for controlling the buck-boost converter shown in FIG. 1 comprises steps S11-S14. At step S11, setting the buck-boost converter to work in the buck mode, the boost mode or the buck-boost mode based on the input voltage $V_{IN}$ and the output voltage $V_{OUT}$. At step S12, when the buck-boost converter is regulated to work in the buck mode, the power switch module is regulated to operate with buck power switching cycles continuously, wherein in each of the buck power switching cycles, the first power switch SWA and the second power switch SWB are controlled to conduct on and off power switching complementarily, while the third power switch SWC is maintained at the off state and the fourth power switch SWD is maintained at the on state, wherein each of the buck power switching cycles comprise an AD phase during which both of the first power switch SWA and the fourth power switch SWD are in the on state and a BD phase during which both of the second power switch SWB and the fourth power switch SWA are in the on state. At step S13, when the buck-boost converter is regulated to work in the boost mode, the power switch module is regulated to operate with boost power switching cycles continuously, wherein in each of the boost power switching cycles, the third power switch SWC and the fourth power switch SWD are controlled to conduct on and off power switching complementarily, while the first power switch SWA is maintained at the on state and the second power switch SWB is maintained at the off state, wherein each of the boost power switching cycles comprises an AC phase during which both of the first power switch SWA and the third power switch SWC are in the on state, and the AD phase. At step S14, when the buck-boost converter is regulated to work in the buck-boost mode, the power switch module is regulated to operate with buck-boost power switching cycles continuously, wherein each of the buck-boost power switching cycles comprises the AC phase, the AD phase and the BD phase, wherein the duty cycle of the AC phase $D_{AC}$ is controlled and determined by a reference signal REF, a feedback signal VFB indicative of the output voltage $V_{OUT}$ and an inductor current sense signal CS indicative of a current passing through the inductor L. The duty cycle of the AD phase $D_{AD}$ is controlled and maintained at a preset duty threshold $D_{ON1}$, the time periods of the buck power switching cycle, the boost power switching cycle and the buck-boost power switching cycle are all equal.

In one embodiment, step S14 comprises: sensing the output voltage and generating the feedback signal VFB indicative of the output voltage $V_{OUT}$; generating a compensation signal COMP based on the reference signal REF and the feedback signal VFB; sensing the current flowing through the inductor L and generating the inductor current sense signal CS; comparing the inductor current sense signal CS with the compensation signal COMP; and terminating the AC phase when the inductor current sense signal CS is increased to reach the compensation signal COMP.

In one embodiment, when the buck-boost converter is arranged to power switch from the buck mode to the buck-boost mode, the duty cycle of the AD phase $D_{AD}$ is regulated to decrease to the preset duty threshold $D_{ON1}$ with a decrement equaling a buck duty hysteresis, and when the buck-boost converter is arranged to power switch from the boost mode to the buck-boost mode, the duty cycle of the AD phase $D_{AD}$ is regulated to decrease to the preset duty threshold $D_{ON1}$ with an decrement equaling a boost duty hysteresis, wherein the buck duty hysteresis or the boost duty hysteresis is 5%, 10% or 15%.

Figure 7:
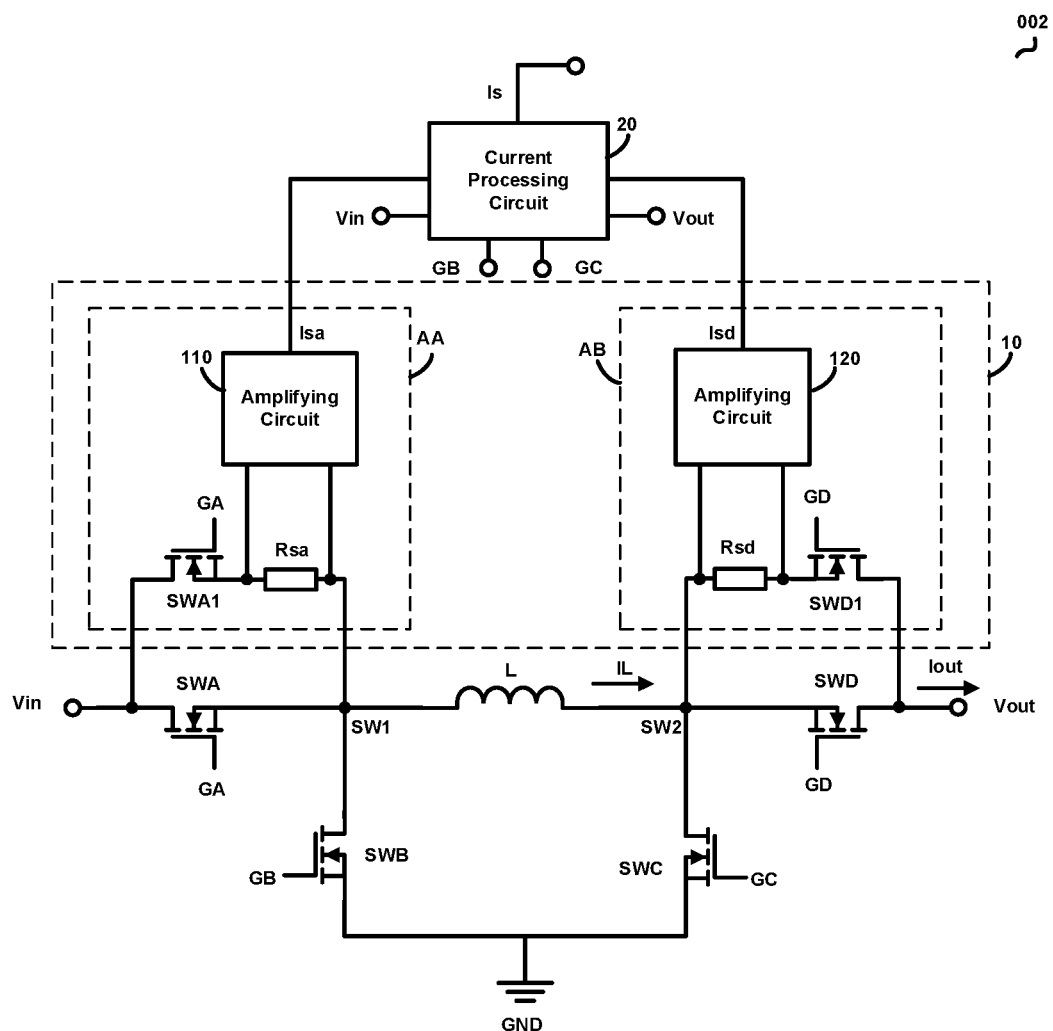
FIG. 7 illustrates a schematic diagram of an output current sensing circuit 002 applied in a buck-boost converter in accordance with an embodiment of the present invention.

FIG. 7 illustrates a schematic diagram of an output current sensing circuit 002 applied in a buck-boost converter in accordance with an embodiment of the present invention. The buck-boost converter of FIG. 7 comprises a first power switch SWA, a second power switch SWB, a third power switch SWC, a fourth power switch SWD and an inductor L. The power switches SWA, SWB, SWC and SWD and the inductor L are configured similarly as they are in the buck-boost converter 100 and are controlled by a first driving signal GA, a second driving signal GB, a third driving signal GC and a fourth driving signal GD respectively. And similarly, the buck-boost converter of FIG. 7 is configured to work in a buck mode with a buck power switching cycle, a boost mode with a boost power switching cycle or a buck-boost mode with a buck-boost power switching cycle. When the buck-boost converter works in the buck mode, the buck power switching cycle comprises an AD phase during which both of the first power switch SWA and the fourth power switch SWD are in the on state and both of the second power switch SWB and the third power switch SWC are in the off state, and a BD phase during which both of the second power switch SWB and the fourth power switch SWD are in the on state and both of the first power switch SWA and the third power switch SWC are in the off state. When the buck-boost converter works in the boost mode, the boost power switching cycle comprises an AC phase (also referred to as an AC boost phase in the boost mode) during which both of the first power switch SWA and the third power switch SWC are in the on state and both of the second power switch SWB and the fourth power switch SWD are in the off state, and an AD phase (also referred to as an AD boost phase in the boost mode) during which the first power switch SWA and the fourth power switch SWD are in the on state and both of the second power switch SWB and the third power switch SWC are in the off state. When the buck-boost converter works in the buck-boost mode, the buck-boost power switching cycle consists of an AC phase (also referred to as an AC buck-boost phase in the buck-boost mode) during which both of the first power switch SWA and the third power switch SWC are in the on state and both of the second power switch SWB and the fourth power switch SWD are in the off state, an AD phase (also referred to as an AD buck-boost phase in the buck-boost mode) during which the first power switch SWA and the fourth power switch SWD are in the on state and both of the second power switch SWB and the third power switch SWC are in the off state, and a BD phase (also referred to as a BD buck-boost phase in the buck-boost mode) during which the second power switch SWB and the fourth power switch SWD are in the on state while the first power switch SWA and the third power switch SWC are in the off state.

Referring to FIG. 7, the output current sensing circuit 002 comprises a current sampling circuit 10 and a current processing circuit 20. The current sampling circuit 10 is coupled to the first power switch SWA and the fourth power switch SWD, and is configured to sample a current flowing through the first power switch SWA and a current flowing through the fourth power switch SWD, and the current sampling circuit 10 is configured to provide a first sampling current Isa representing the current flowing through the first power switch SWA and to provide a second sampling current Isd representing the current flowing through the fourth power switch SWD. In one embodiment, the current sampling circuit 10 comprises a first sampling circuit AA configured to sample the current flowing through the first power switch SWA and a second sampling circuit AB configured to sample the current flowing through the fourth power switch SWD. The first sampling circuit AA comprises a first input terminal, a second input terminal and an output terminal, wherein the first input terminal of the first sampling circuit AA is coupled to the drain of the first power switch SWA, the second input terminal of the first sampling circuit AA is coupled to the source of the first power switch SWA, and the output terminal of the first sampling circuit AA is configured to provide the first sampling current Isa. The second sampling circuit AB comprises a first input terminal, a second input terminal and an output terminal, wherein the first input terminal of the second sampling circuit AB is coupled to the source of the fourth power switch SWD, the second input terminal of the second sampling circuit AB is coupled to the drain of the fourth power switch SWD, and the output terminal of the second sampling circuit AB is configured to provide the second sampling current Isd.

In one embodiment, the first sampling circuit AA comprises a transistor SWA1, a sampling resistor Rsa and a first amplifying circuit 110. In the embodiment illustrated in FIG. 7, the transistor SWA1 can be a MOSFET. The transistor SWA1 has a source, a drain and a gate, wherein the drain of the transistor SWA1 is coupled to the drain of the first power switch SWA, and the gate of the transistor SWA1 is configured to receive the first driving signal GA. The sampling resistor Rsa comprises a first terminal and a second terminal, wherein the first terminal of the sampling resistor Rsa is coupled to the source of the transistor SWA1, the second terminal of the sampling resistor Rsa is coupled to the source of the first power switch SWA. The first amplifying circuit 110 is configured to receive a voltage across the sampling resistor Rsa, and is configured to amplify the voltage across the sampling resistor Rsa and to therefor provide the first sampling current Isa. In one embodiment, the first amplifying circuit 110 is implemented with a signal amplifier.

In one embodiment, the second sampling circuit AB comprises a transistor SWD1, a sampling resistor Rsd and a second amplifying circuit 120. In the embodiment illustrated in FIG. 7, the transistor SWD1 can be a MOSFET. The transistor SWD1 has a source, a drain and a gate, the drain of the transistor SWD1 is coupled to the drain of the fourth power switch SWD, the gate of the transistor SWD1 is configured to receive the fourth driving signal GD. The sampling resistor Rsd comprises a first terminal and a second terminal, wherein the first terminal of the sampling resistor Rsd is coupled to the source of the transistor SWD1, the second terminal of the sampling resistor Rsd is coupled to the source of the fourth power switch SWD. The second amplifying circuit 120 is configured to receive a voltage across the sampling resistor Rsd, and is configured to amplify the voltage across the sampling resistor Rsd and to provide the second sampling current Isd. In one embodiment, the second amplifying circuit 120 is implemented with a signal amplifier.

In one embodiment, the current processing circuit 20 comprises a first input terminal to receive the first sampling current Isa, a second input terminal to receive the second sampling current Isd, a third input terminal to receive an input voltage $V_{IN}$ of the buck-boost converter, a fourth input terminal to receive an output voltage $V_{OUT}$ of the buck-boost converter, a fifth input terminal to receive the second driving signal GB, a sixth input terminal to receive the third driving signal GC, and an output terminal to provide a third sampling current Is.

In the embodiment illustrated in FIG. 7, the current processing circuit 20 is coupled to the current sampling circuit 10 to receive the first sampling current Isa and the second sampling current Isd, and is configured to generate the third sampling current Is based on the first sampling current Isa and the second sampling current Isd. An average value of the third sampling current Is during one power switching cycle (one buck power switching cycle in the buck mode, one boost power switching cycle in the boost mode, or one buck-boost power switching cycle in the buck-boost mode) represents an output current Iout of the buck-boost converter.

Figure 8:
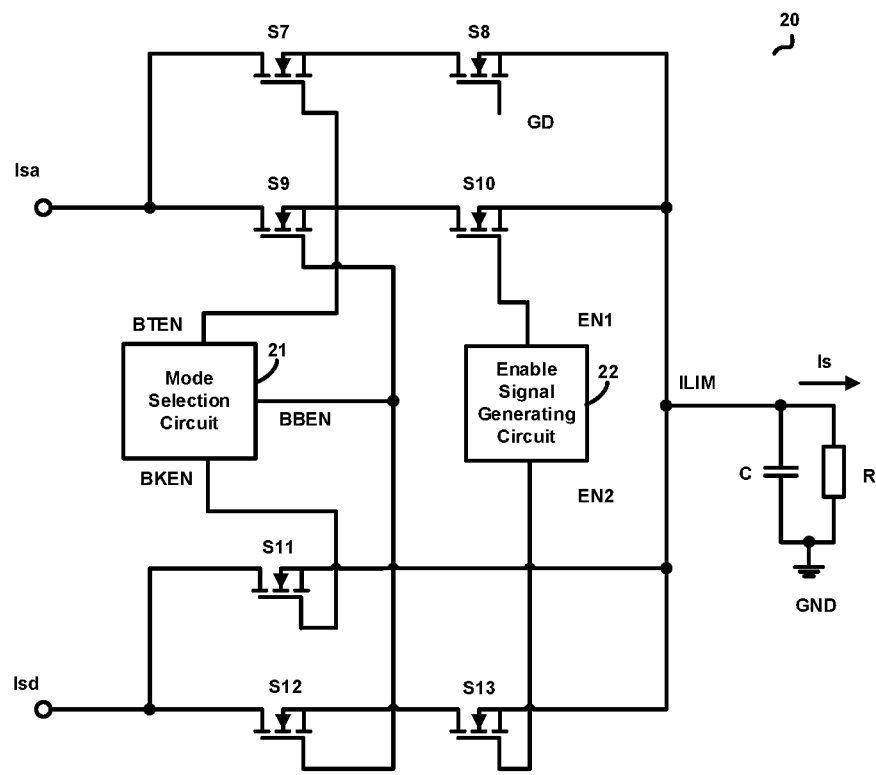
FIG. 8 illustrates an exemplary circuit of the current processing circuit 20 shown in FIG. 7 in accordance with an embodiment of the present invention.

FIG. 8 illustrates an exemplary circuit of the current processing circuit 20 shown in FIG. 7 in accordance with an embodiment of the present invention. In one embodiment, the current processing circuit 20 comprises a mode selection circuit 21 and an enable signal generating circuit 22.

The mode selection circuit 21 in FIG. 8 can be implemented with the mode selection circuit 11 as shown in FIG. 1. The mode selection circuit 21 is configured to generate a buck mode enable signal BKEN, a boost mode enable signal BTEN and a buck-boost mode enable signal BBEN to control the buck-boost converter of FIG. 7 to work in the buck mode, the boost mode or the buck-boost mode. In one embodiment, only one of the buck mode enable signal BKEN, the boost mode enable signal BTEN and the buck-boost mode enable signal BBEN is in an active state at a time. When the buck mode enable signal BKEN is in an active state, the buck-boost converter is configured to work in the buck mode. When the boost mode enable signal BTEN is in an active state, the buck-boost converter is configured to work in the boost mode. When the buck-boost mode enable signal BBEN is in an active state, the buck-boost converter is configured to work in the buck-boost mode.

The enable signal generating circuit 22 is configured to generate a first enable signal EN1 and a second enable signal EN2 based on the second driving signal GB and the third driving signal GC. In one embodiment, only during a period from the third power switch SWC is turned off to the second power switch SWB is turned on, the first enable signal EN1 is logic high. Only during a period from the second power switch SWB is turned on to the third power switch SWC is turned on, the second enable signal EN2 is logic high.

In the embodiment illustrated in FIG. 8, the current processing circuit 20 comprises transistors S7~S13. In the embodiment illustrated in FIG. 8, the transistors S7~S13 can be MOSFETs. Each of the transistors S7~S13 has a source, a drain and a gate. The drain of the transistor S7 is configured to receive the first sampling current Isa, the gate of the transistor S7 is configured to receive the boost mode enable signal BTEN. The drain of the transistor S8 is coupled to the source of the transistor S7, the gate of the transistor S8 is configured to receive the fourth driving signal GD. The drain of the transistor S9 is configured to receive the first sampling current Isa, the gate of the transistor S9 is configured to receive the buck-boost mode enable signal BBEN. The drain of the transistor S10 is coupled to the source of the transistor S9, the gate of the transistor S10 is configured to receive the first enable signal EN1. The drain of the transistor S11 is configured to receive the second sampling current Isd, the gate of the transistor S11 is configured to receive the buck mode enable signal BKEN. The drain of the transistor S12 is configured to receive the second sampling current Isd, the gate of the transistor S12 is configured to receive the buck-boost mode enable signal BBEN. The drain of the transistor S13 is coupled to the source of the transistor S12, the gate of the transistor S13 is configured to receive the second enable signal EN2. The sources of the transistors S8, S10, S11 and S13 forms a common node ILIM, and the common node ILIM is configured to provide the third sampling current Is.

In the embodiment illustrated in FIG. 8, the current processing circuit 20 further comprises a capacitor C and an output resistor R. The capacitor C has a first terminal and a second terminal, wherein the first terminal of the capacitor C is coupled to the common node ILIM to receive the third sampling current Is, and the second terminal of the capacitor C is coupled to a reference ground GND. The output resistor R has a first terminal and a second terminal, wherein the first terminal of the output resistor R is coupled to the common node ILIM to receive the third sampling current Is, and the second terminal of the output resistor R is coupled to the reference ground GND. The capacitor C and the output resistor R are configured to obtain the average value of the third sampling current Is during one power switching cycle.

Figure 9:
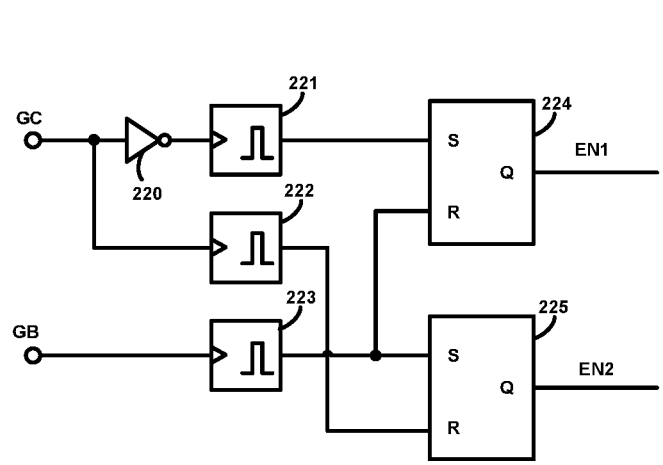
FIG. 9 illustrates an exemplary circuit of the enable signal generating circuit 22 shown in FIG. 8 in accordance with an embodiment of the present invention.

FIG. 9 illustrates an exemplary circuit of the enable signal generating circuit 22 shown in FIG. 8 in accordance with an embodiment of the present invention. The enable signal generating circuit 22 comprises a NOT gate 220, a first monostable trigger 221, a second monostable trigger 222, a third monostable trigger 223, a first RS trigger 224 and a second RS trigger 225. The NOT gate 220 comprises an input terminal and an output terminal, wherein the input terminal of the NOT gate 220 is configured to receive the third driving signal GC, and the output terminal of the NOT gate 220 is configured to provide an inverting signal of the third driving signal GC. The first monostable trigger 221 comprises an input terminal and an output terminal, wherein the input terminal of the first monostable trigger 221 is coupled to the output terminal of the NOT gate 220 to receive the inverting signal of the third driving signal GC, and the first monostable trigger 221 is configured to generate a first trigger signal based on the inverting signal of the third driving signal GC. When the first monostable trigger 221 receives a rising edge of the inverting signal of the third driving signal GC, the first trigger signal turns to logic high and keeps in logic high for a first predetermined time, otherwise, the first trigger signal is logic low. The second monostable trigger 222 comprises an input terminal and an output terminal, wherein the input terminal of the second monostable trigger 222 is configured to receive the third driving signal GC. The second monostable trigger 222 is configured to generate a second trigger signal based on the third driving signal GC. When the second monostable trigger 222 receives a rising edge of the third driving signal GC, the second trigger signal turns to logic high and keeps in logic high for a second predetermined time, otherwise, the second trigger signal is logic low. The third monostable trigger 223 comprises an input terminal and an output terminal, wherein the input terminal of the third monostable trigger 223 is configured to receive the second driving signal GB, and the third monostable trigger 223 is configured to generate a third trigger signal according to the second driving signal GB. When the third monostable trigger 223 receives a rising edge of the second driving signal GB, the third trigger signal turns to logic high and keeps in logic high for a third predetermined time, otherwise, the third trigger signal is logic low.

The first RS trigger 224 comprises a set terminal S, a reset terminal R and an output terminal Q, wherein the set terminal S of the first RS trigger is coupled to the output terminal of the first monostable trigger 221 to receive the first trigger signal, and the reset terminal R of the first RS trigger 224 is coupled to the output terminal of the third monostable trigger 223 to receive the third trigger signal. The first RS trigger 224 is configured to generate the first enable signal EN1 based on the first trigger signal and the third trigger signal, and the output terminal of the first RS trigger 224 is configured to provide the first enable signal EN1. When the first trigger signal is logic high, the first enable signal EN1 is logic high. When the third trigger signal is logic high, the first enable signal EN1 is logic low. When both the first trigger signal and the third trigger signal are logic low, the first enable signal EN1 keeps unchanged. The second RS trigger 225 comprises a set terminal S, a reset terminal R and an output terminal Q, wherein the set terminal S of the second RS trigger 225 is coupled to the output terminal of the third monostable trigger 223 to receive the third trigger signal, and the reset terminal R of the second RS trigger 225 is coupled to the output terminal of the second monostable trigger 222 to receive the second trigger signal. The second RS trigger 225 is configured to generate the second enable signal EN2 based on the second trigger signal and the third trigger signal, and the output terminal of the second RS trigger 225 is configured to provide the second enable signal EN2. When the third trigger signal is logic high, the second enable signal EN2 is logic high. When the second trigger signal is logic high, the second enable signal EN2 is logic low. When both the second trigger signal and the third trigger signal are logic low, the second enable signal EN2 keeps unchanged.

In one embodiment, the enable signal generating circuit can exclude the monostable trigger 221, the monostable trigger 222 and the monostable trigger. The NOT gate 220 can be replaced by other logic circuits.

Figure 10:
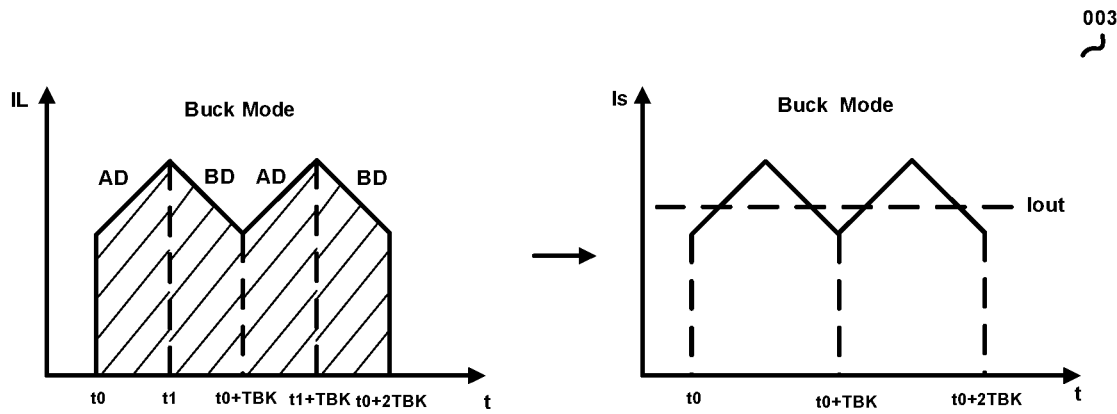
FIG. 10 shows waveforms 003 of an inductor current IL flowing through the inductor L and the third sampling current Is when the buck-boost converter of FIG. 7 works in the buck mode according to an embodiment of the present invention.

FIG. 10 shows waveforms 003 of an inductor current IL flowing through the inductor L and the third sampling current Is when the buck-boost converter of FIG. 7 works in the buck mode according to an embodiment of the present invention. When the buck-boost converter works in the buck mode, the third power switch SWC is maintained at the off state and the fourth power switch SWD is maintained at the on state, while the first power switch SWA and the second power switch SWB are controlled to conduct on and off power switching complementarily, i.e., when the first power switch SWA is switched on, the second power switch SWB is switched off, and vice versa. From a moment t0 to a moment t1, the first power switch SWA and the fourth power switch SWD are on, the second power switch SWB and the third power switch SWC are off, the inductor current IL increases with a slope $S_{ADBK}$, and the third sampling current equals to the second sampling current Isd. From the moment t1 to a moment t0+TBK, the second power switch SWB and the fourth power switch SWD are on, the first power switch SWA and the third power switch SWC are off, the inductor current IL decreases with a slope $S_{BDBK}$, and the third sampling current equals to the second sampling current Isd. From the moment t0+TBK to a moment t1+TBK, the first power switch SWA and the fourth power switch SWD are on, the second power switch SWB and the third power switch SWC are off, the inductor current IL increases with the slope $S_{ADBK}$, and the third sampling current equals to the second sampling current Isd. From the moment t1+TBK to a moment t0+2 TBK, the second power switch SWB and the fourth power switch SWD are on, the first power switch SWA and the third power switch SWC are off, and the inductor current IL decreases with the slope $S_{BDBK}$, and the third sampling current equals to the second sampling current Isd. As illustrated in the dash area in FIG. 10, during one buck power switching cycle TBK, the inductor current IL equals to the current flowing through the fourth power switch SWD all the while, that is, when the buck-boost converter works in the buck mode, an average value of the second sampling current Isd during one buck power switching cycle TBK represents the output current Iout.

Figure 11:
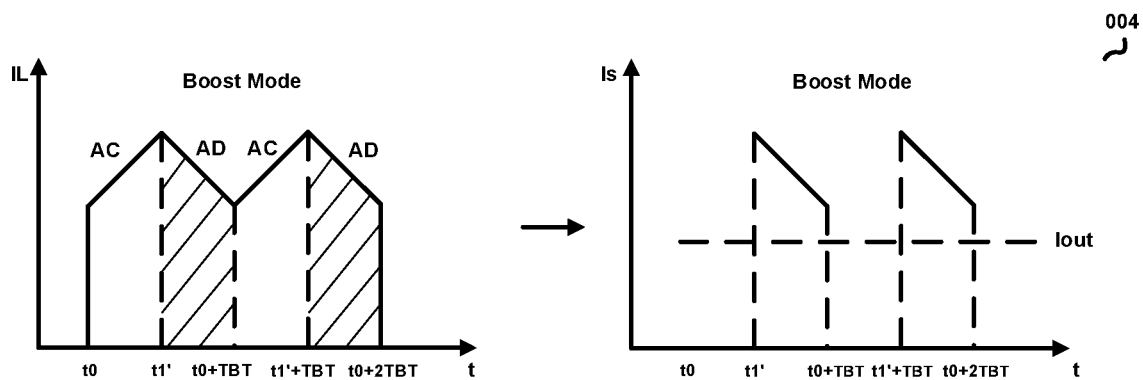
FIG. 11 shows waveforms 004 of the inductor current IL flowing through the inductor L and the third sampling current Is when the buck-boost converter of FIG. 7 works in the boost mode according to an embodiment of the present invention.

FIG. 11 shows waveforms 004 of the inductor current IL flowing through the inductor L and the third sampling current Is when the buck-boost converter of FIG. 7 works in the boost mode according to an embodiment of the present invention. When the buck-boost converter works in the boost mode, the first power switch SWA is maintained at the on state, the second power switch SWB is maintained at the off state, while the third power switch SWC and the fourth power switch SWD are controlled to conduct on and off power switching complementarily, i.e., when the third power switch SWC is power switched on, the fourth power switch SWD is power switched off and vice versa. From the moment t0 to the moment t1', the first power switch SWA and the third power switch SWC are on, the second power switch SWB and the fourth power switch SWD are off, the inductor current IL increases with a slope $S_{ACBT}$, and no current flows through the fourth power switch SWD. From the moment t1' to the moment t0+TBT, the first power switch SWA and the fourth power switch SWD are on, the second power switch SWB and the third power switch SWC are off, the inductor current IL decreases with a slope $S_{ADBT}$. From the moment t0+TBT to the moment t1'+TBT, the first power switch SWA and the third power switch SWC are on, the second power switch SWB and the fourth power switch SWD are off, the inductor current IL increases with the slope $S_{ACBT}$, and no current flows through the fourth power switch SWD. From the moment t1'+TBT to the moment t0+2TBT, the first power switch SWA and the fourth power switch SWD are on, the second power switch SWB and the third power switch SWC are off, the inductor current IL decreases with the slope $S_{ADBT}$.

When the buck-boost converter works in the boost mode, the current processing circuit 20 is configured to provide the third sampling current Is equal to the first sampling current Isa when the fourth power switch SWD is on and to provide the third sampling current Is equal to zero when the fourth power switch SWD is off. As illustrated in the dash area in FIG. 11, during one boost power switching cycle from t0 to t0+TBT or one boost power switching cycle from t0+TBT to t0+2TBT, the inductor current IL flows through the fourth power switch SWD only during a period from t1' to t0+TBT or a period from t1'+TBT to t0+2TBT, and the current flowing through the first power switch SWA is equal to the current flowing the fourth power switch SWD during the period from t1' to t0+TBT or the period from t1'+TBT to t0+2TBT. Thus the average value of the third sampling current Is during one boost power switching cycle TBT represents the output current Iout.

When the fourth power switch SWD is turned on at the moment t1' or t1'+TBT, a current peak usually flows through the fourth power switch SWD and thus a blanking time is often set up to eliminate the effect of the current peak. And in addition, a current sensing amplifier is usually used to sense the current flowing through the fourth power switch SWD, and a delay may exist due to the limited bandwidth of the current sensing amplifier. Thus, the traditional output current sensing method using the current sensing amplifier to sense the current flowing through the fourth power switch SWD has low accuracy.

In the present invention, the current flowing through the first power switch SWA during the period from t1' to t0+TBT or the period from t1'+TBT to t0+2TBT is sensed instead of the current flowing through the fourth power switch SWD. Since the first power switch SWA has been turned on before the moment t1' or the moment t1'+TBT, no current speak will flow through the first power switch SWA at the moment t1' or t1'+TBT, the effects caused by the current peak and the sensing delay are eliminated.

Figure 12:
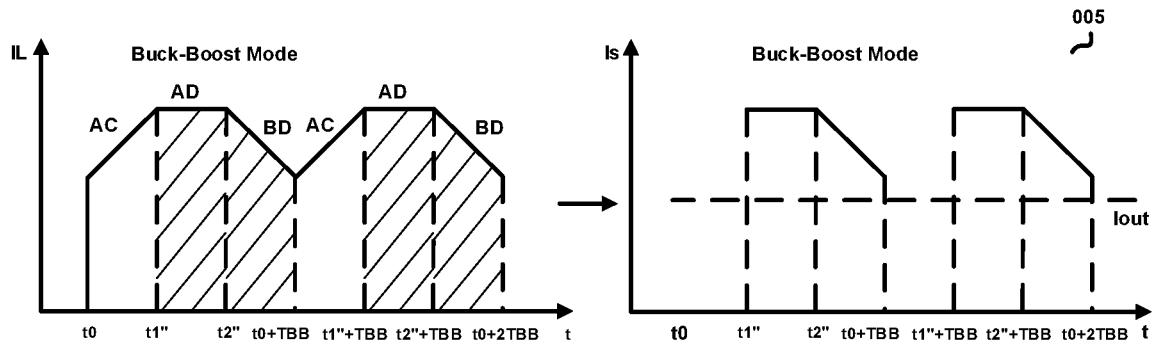
FIG. 12 shows waveforms 005 of the inductor current IL flowing through the inductor L and the third sampling current Is when the buck-boost converter of FIG. 7 works in the buck-boost mode according to an embodiment of the present invention.

FIG. 12 shows waveforms 005 of the inductor current IL flowing through the inductor L and the third sampling current Is when the buck-boost converter of FIG. 7 works in the buck-boost mode according to an embodiment of the present invention. When the buck-boost converter works in the buck-boost mode, the buck-boost power switching cycle consists of the AC phase, the AD phase and the BD phase. From the moment t0 to the moment t1", the buck-boost converter works in the AC phase, the first power switch SWA and the third power switch SWC are on, the second power switch SWB and the fourth power switch SWD are off, the inductor current IL increases with a slope $S_{ACBB}$, and no current flows through the fourth power switch SWD. From the moment t1" to the moment t2", the buck-boost converter works in the AD phase, the first power switch SWA and the fourth power switch SWD are on, the second power switch SWB and the third power switch SWC are off, the inductor current IL keeps unchanged. From the moment t2" to the moment t0+TBB, the buck-boost converter works in the BD phase, the second power switch SWB and the fourth power switch SWD are on, the first power switch SWA and the third power switch SWC are off, the inductor current IL decreases with a slope $S_{BDBB}$. From the moment t0+TBB to the moment t1"+TBB, the buck-boost converter works in the AC phase, the first power switch SWA and the third power switch SWC are on, the second power switch SWB and the fourth power switch SWD are off, the inductor current IL increases with the slope $S_{ACBB}$, and no current flows through the fourth power switch SWD. From the moment t1"+TBB to the moment t2"+TBB, the buck-boost converter works in the AD phase, the first power switch SWA and the fourth power switch SWD are on, the second power switch SWB and the third power switch SWC are off, the inductor current IL keeps unchanged. From the moment t2"+TBB to the moment t0+2TBB, the buck-boost converter works in the BD phase, the second power switch SWB and the fourth power switch SWD are on, the first power switch SWA and the third power switch SWC are off, the inductor current IL decreases with the slope $S_{BDBB}$.

When the buck-boost converter works in the buck-boost mode, the current processing circuit 20 is configured to provide the third sampling current Is equal to zero during the AC phase, equal to the first sampling current Isa during the AD phase and equal to the second sampling current Isd during the BD phase. As illustrated in the dash area in FIG. 12, during one buck-boost power switching cycle from t0 to t0+TBB or one buck-boost power switching cycle from t0+TBB to t0+2TBB, the inductor current IL flows through the fourth power switch SWD only during the AD phase and the BD phase, and the current flowing through the first power switch SWA is equal to the current flowing the fourth power switch SWD during the AD phase. Thus the average value of the third sampling current Is during one buck-boost power switching cycle TBB represents the output current Iout.

When the fourth power switch SWD is turned on at the moment t1" or t1"+TBT, a current peak usually flows through the fourth power switch SWD and thus a blanking time is often set up to eliminate the effect of the current peak. And in addition, a current sensing amplifier is usually used to sense the current flowing through the fourth power switch SWD, and a sensing delay may exist due to the limited bandwidth of the current sensing amplifier. Thus, the traditional output current sensing method using the current sensing amplifier to sense the current flowing through the fourth power switch SWD during the AD phase has low accuracy.

In the present invention, the current flowing through the first power switch SWA during the AD phase is sensed instead of the current flowing through the fourth power switch SWD. Since the first power switch SWA has been turned on during the AC phase before the AD phase, no current speak will flow through the first power switch SWA at the moment t1" or t1"+TBB, the effects caused by the current peak and the sensing delay are eliminated. And the current flowing through the fourth power switch SWD during the BD phase is sensed. Since the fourth power switch SWD has been turned on during the AD phase before the BD phase, no current speak will flow through the fourth power switch SWD at the moment t2" or t2"+TBB, no current peak and no sensing delay exist.

Figure 13:
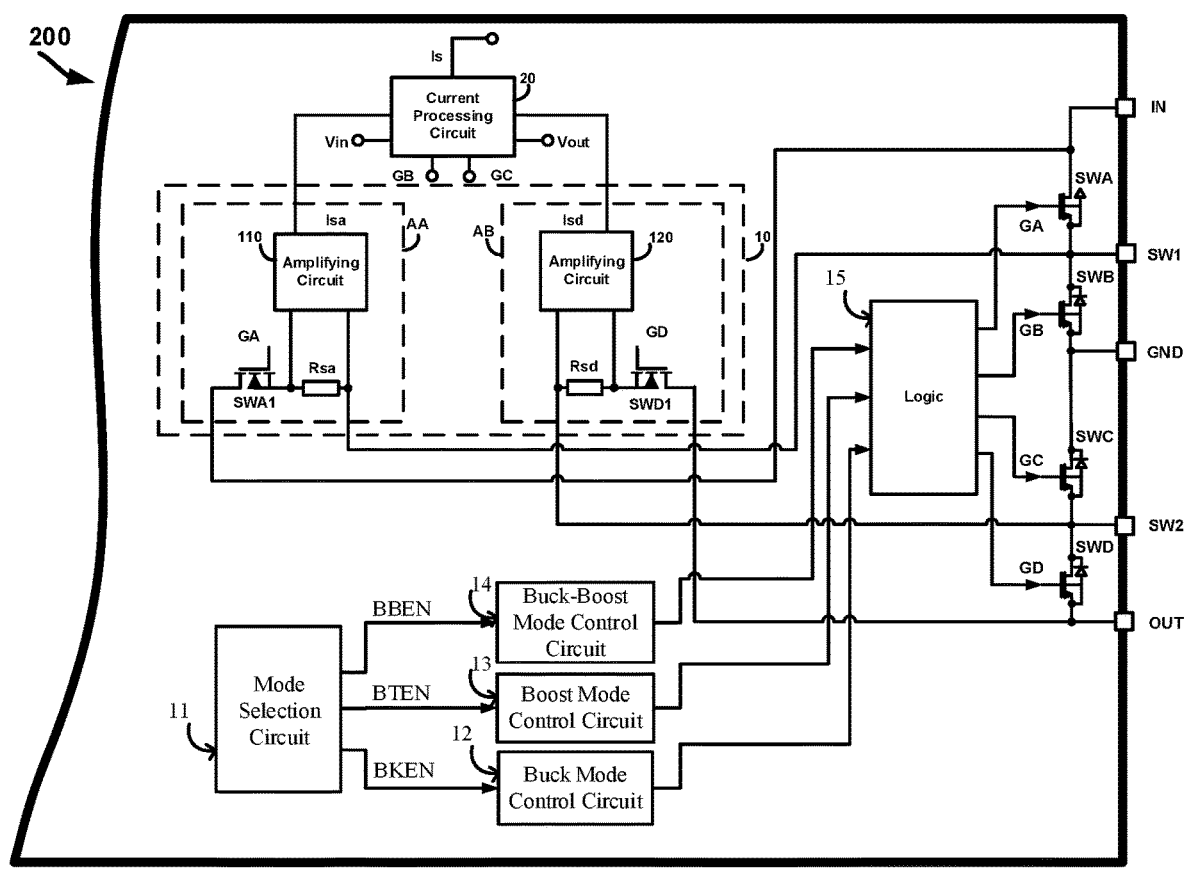
FIG. 13 illustrates a schematic diagram of a buck-boost integrated circuit 200 in accordance with an embodiment of the present invention.

FIG. 13 illustrates a schematic diagram of a buck-boost integrated circuit 200 in accordance with an embodiment of the present invention.

As shown in FIG. 13, the integrated circuit 200 integrates a first power switch SWA, a second power switch SWB, a third power switch SWC and a fourth power SWD, an output current sensing circuit and a control circuit inside the integrated circuit 200. That is, the first power switch SWA, the second power switch SWB, the third power switch SWC and the fourth power SWD, the output current sensing circuit and the control circuit are fabricated in the same semiconductor die. The first power switch SWA, the second power switch SWB, the third power switch SWC and the fourth power SWD are configured and coupled with each other in the same way as they are in FIG. 1. The output current sensing circuit in FIG. 13 can be implemented with the output current sensing circuit(s) as illustrated in one of or the combination of the embodiments of FIG. 7~FIG. 9. And the control circuit in FIG. 13 can be implemented with the control circuit(s) as illustrated in one of or the combination of the embodiments of FIG. 1~FIG. 4. For the purpose of brevity, they are not elaborated here anymore.

As the first power switch SWA, the second power switch SWB, the third power switch SWC and the fourth power SWD are integrated together with the output current sensing circuit and the control circuit inside the integrated circuit 200, the integrated circuit 200 are more compact compared with the traditional solution that the first power switch SWA, the second power switch SWB, the third power switch SWC and the fourth power SWD are externally coupled to an integrated circuit integrating the output current sensing circuit and the control circuit. And in addition, with the first power switch SWA, the second power switch SWB, the third power switch SWC and the fourth power SWD being integrated together with the output current sensing circuit and the control circuit inside the integrated circuit 200, the accuracy of the output current sensing is higher. As the size of the first power switch SWA, the second power switch SWB, the third power switch SWC and the fourth power SWD is known during design when they are integrated inside the integrated circuit 200 and the size of transistors SWA1 and SWD1 can be thus well designed. In comparison, when the first power switch SWA, the second power switch SWB, the third power switch SWC and the fourth power SWD are external, the size of the power switches may vary with the choice of different customers and are thus not known to the transistors SWA1 and SWD1, and with the fixed size of the transistors SWA1 and SWD1, the accuracy of the output current sensing circuit is low.

Figure 14:
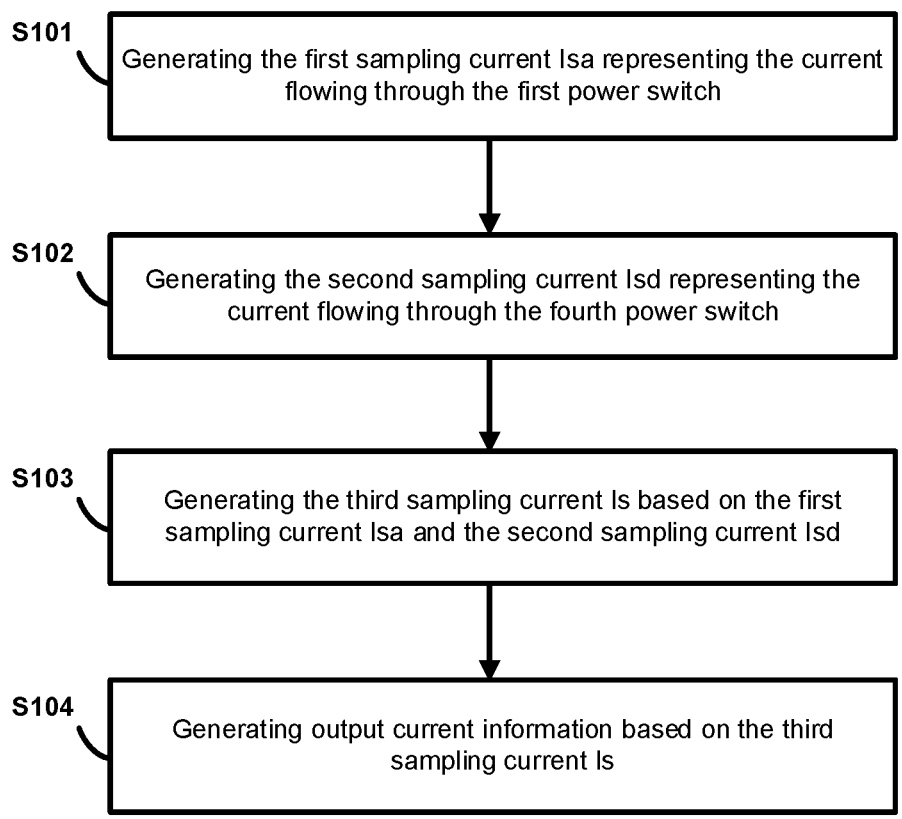
FIG. 14 shows a flow chart 006 illustrating an output current sensing method for sensing an output current information of a buck-boost converter according to an embodiment of the present invention.

FIG. 14 shows a flow chart 006 illustrating an output current sensing method for sensing an output current information of a buck-boost converter according to an embodiment of the present invention. The buck-boost converter receives an input voltage and provides an output voltage. The buck-boost converter has a first power switch, a second power switch, a third power switch and a fourth power switch. The buck-boost converter operates in a buck mode, a boost mode or a buck-boost mode. The buck-boost converter in the embodiment of FIG. 14 can be configured as it is in the embodiment of FIG. 1, and in addition, the buck-boost converter in the embodiment of FIG. 14 can operate as it does in the embodiment of FIG. 1. For the purpose of brevity, it is not elaborated herein. The output current sensing method comprises steps S101-S104:

At the step S101, generating a first sampling current Isa representing the current flowing through the first power switch.

At the step S102, generating a second sampling current Isd representing the current flowing through the fourth power switch.

At the step S103, generating a third sampling current Is based on the first sampling current Isa and the second sampling current Isd.

At the step S104, generating output current information based on the third sampling current Isd, wherein the average value of the third sampling current Is of one power switching cycle T of the buck-boost converter represents the output current information of the buck-boost converter.

In one embodiment, the output current sensing method further comprises: generating a buck mode enable signal, a boost mode enable signal and a buck-boost mode enable signal based on the input voltage and the output voltage; generating a first enable signal and a second enable signal based on whether the second power switch and the third power switch are on or off, and generating the third sampling current Is further based on the buck mode enable signal, the boost mode enable signal, the buck-boost mode enable signal, the first enable signal and the second enable signal.

In one embodiment, the buck-boost converter has a buck power switching cycle in the buck mode, a boost power switching cycle in the boost mode and a buck-boost power switching cycle in the buck-boost mode. The boost power switching cycle comprises a first boost phase and a second boost phase, and the buck-boost power switching cycle consists of a first buck-boost phase, a second buck-boost phase and a third buck-boost phase. The third sampling current Is equals to the second sampling current Isd during the buck power switching cycle. The third sampling current Is equals to the first sampling current Isa during the second boost phase and equals to zero during the first boost phase. The third sampling current Is equals to zero during the first buck-boost phase, equals to the first sampling current Isa during the second buck-boost phase, and equals to the second sampling current Isd during the third buck-boost phase.

The advantages of the various embodiments of the buck-boost converter is not confine to those described above. These and other advantage of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:

1. An integrated circuit of a buck-boost converter, wherein the buck-boost converter has an inductor externally coupled to the integrated circuit and the inductor has a first terminal and a second terminal, and the buck-boost converter operates in a buck mode with a buck power switching cycle, a boost mode with a boost power switching cycle or a buck-boost mode with a buck-boost power switching cycle, the integrated circuit comprising:
    an input pin, a reference ground pin, a first power switching pin, a second power switching pin and an output pin, wherein the first power switching pin is coupled to the first terminal of the inductor and the second power switching pin is coupled to the second terminal of the inductor;
    a first power switch, a second power switch, a third power switch and a fourth power switch, wherein the first power switch and the second power switch are coupled in series between the input pin and the reference ground pin and form a first common node coupled to the first power switching pin, and the third power switch and the fourth power switch are coupled in series between the output pin and the reference ground pin and form a second common node coupled to the second power switching pin; and
    an output current sensing circuit, comprising:
    a first sampling circuit, configured to provide a first sampling current representing a current flowing through the first power switch;
    a second sampling circuit, configured to provide a second sampling current representing a current flowing through the fourth power switch; and
    a current processing circuit, configured to generate a third sampling current based on the first sampling current and the second sampling current, wherein the buck-boost power switching cycle consists of a first buck-boost phase, a second buck-boost phase and a third buck-boost phase, wherein during one buck-boost power switching cycle, each of the first buck-boost phase, the second buck-boost phase and the third buck-boost phase is not repeated, and wherein a time period corresponding to the complete buck-boost power switching cycle is the sum of a time period of the first buck-boost phase, a time period of the second buck-boost phase and a time period of the third buck-boost phase, and wherein the third sampling current equals to zero during the first buck-boost phase, equals to the first sampling current during the second buck-boost phase, and equals to the second sampling current during the third buck-boost phase;

wherein the first power switch, the second power switch, the third power switch and the fourth power switch and the output current sensing circuit are formed in the same semiconductor die.

2. The integrated circuit as claimed in claim 1, wherein the third sampling current equals to the second sampling current during the buck power switching cycle, and wherein the boost power switching cycle comprises a first boost phase and a second boost phase, and the third sampling current equals to zero during the first boost phase and equals to the first sampling current during the second boost phase.

3. The integrated circuit as claimed in claim 2, wherein the first buck-boost phase is a phase in the buck-boost mode when the first power switch and the third power switch are on and the second power switch and the fourth power switch are off, the second buck-boost phase is a phase in the buck-boost mode when the first power switch and the fourth power switch are on and the second power switch and the third power switch are off, the third buck-boost phase is a phase in the buck-boost mode when the second power switch and the fourth power switch are on and the first power switch and the third power switch are off, and wherein the first boost phase is a phase in the boost mode when the first power switch and the third power switch are on and the second power switch and the fourth power switch are off, and the second boost phase is a phase in the boost mode when the first power switch and the fourth power switch are on and the second power switch and the third power switch are off.

4. The integrated circuit as claimed in claim 1, wherein the first power switch and the second power switch are coupled in series between an input terminal and a reference ground and form a first common node, and the third power switch and the fourth power switch are coupled in series between an output terminal and the reference ground and form a second common node, and wherein the buck-boost converter further comprises the inductor coupled between the first common node and the second common node.

5. The integrated circuit as claimed in claim 1,
wherein the first sampling circuit comprises:
 a first transistor having a source, a drain and a gate, wherein the drain of the first transistor is coupled to a drain of the first power switch, and the gate of the first transistor is configured to receive a first driving signal for driving the first power switch;
 a first sampling resistor having a first terminal and a second terminal, wherein the first terminal of the first sampling resistor is coupled to the source of the first transistor, and the second terminal of the first sampling resistor is coupled to a source of the first power switch; and a first amplifying circuit configured to amplify a voltage across the first sampling resistor and to generate the first sampling current; and wherein the second sampling circuit comprises:
 a second transistor having a source, a drain and a gate, wherein the drain of the second transistor is coupled to a drain of the second power switch, and the gate of the second transistor is configured to receive a second driving signal for driving the second power switch;
 a second sampling resistor having a first terminal and a second terminal, wherein the first terminal of the second sampling resistor is coupled to the source of the second transistor, and the second terminal of the second sampling resistor is coupled to a source of the second power switch; and
 a second amplifying circuit configured to amplify a voltage across the second sampling resistor and to generate the second sampling current.

6. The integrated circuit as claimed in claim 1, wherein the current processing circuit comprises:
 a mode selection circuit, configured to generate a buck mode enable signal, a boost mode enable signal and a buck-boost mode enable signal based on an input voltage and an output voltage of the buck-boost converter;
 an enable signal generating circuit, configured to generate a first enable signal and a second enable signal based on a second driving signal for driving the second power switch and a third driving signal for driving the third power switch;
 a third transistor, having a first terminal, a second terminal and a third terminal, wherein the second terminal of the third transistor is configured to receive the first sampling current, and the third terminal of the third transistor is configured to receive the boost mode enable signal;
 a fourth transistor, having a first terminal, a second terminal and a third terminal, wherein the second terminal of the fourth transistor is coupled to the first terminal of the third transistor, and the third terminal of the fourth transistor is configured to receive a fourth driving signal for driving the fourth power switch;
 a fifth transistor, having a first terminal, a second terminal and a third terminal, wherein the second terminal of the fifth transistor is configured to receive the first sampling current, and the third terminal of the fifth transistor is configured to receive the buck-boost mode enable signal;
 a sixth transistor, having a first terminal, a second terminal and a third terminal, wherein the second terminal of the sixth transistor is coupled to the first terminal of the fifth transistor, and the third terminal of the sixth transistor is configured to receive the first enable signal;
 a seventh transistor, having a first terminal, a second terminal and a third terminal, wherein the second terminal of the seventh transistor is configured to receive the second sampling current, and the third terminal of the seventh transistor is configured to receive the buck mode enable signal;
 an eighth transistor, having a first terminal, a second terminal and a third terminal, wherein the second terminal of the eighth transistor is configured to receive the second sampling current, and the third terminal of the eighth transistor is configured to receive the buck-boost mode enable signal; and a ninth transistor, having a first terminal, a second terminal and a third terminal, wherein the second terminal of the ninth transistor is coupled to the first terminal of the eighth transistor, and the third terminal of the ninth transistor is configured to receive the second enable signal, wherein the first terminal of the fourth transistor, the first terminal of the sixth transistor, the first terminal of the seventh transistor and the first terminal of the ninth transistor are coupled to a common point to provide the third sampling current.

7. The integrated circuit as claimed in claim 6, wherein the mode selection circuit comprises:
a buck comparator having a first input terminal configured to receive the input voltage, a second input terminal configured to receive the product of the output voltage and a first threshold, and an output terminal configured to provide the buck mode enable signal, wherein the first threshold is a constant higher than 1;
a boost comparator having a first input terminal configured to receive the input voltage, a second input terminal configured to receive the product of the output voltage and a second threshold, and an output terminal configured to provide the boost mode enable signal, wherein the second threshold is a constant less than 1 and higher than 0; and
a NOR gate having a first input terminal configured to receive the buck mode enable signal, a second input terminal configured to receive the boost mode enable signal, and an output terminal to provide the buck-boost mode enable signal.

8. The integrated circuit as claimed in claim 6, wherein the enable signal generating circuit comprises:
a first RS trigger, having a set terminal, a reset terminal and an output terminal, wherein the set terminal is configured to receive a falling edge of the third driving signal, the reset terminal is configured to receive a rising edge of the second driving signal; and
a second RS trigger, having a set terminal, a reset terminal and an output terminal, wherein the set terminal of the second RS trigger is configured to receive the rising edge of the second driving signal, and the reset terminal of the second RS trigger is configured to receive a rising edge of the third driving signal.

9. The integrated circuit as claimed in claim 6, further comprising:
a capacitor, coupled to the current processing circuit to receive the third sampling current; and
an output resistor, coupled in parallel with the capacitor;
wherein the capacitor and the output resistor are configured to provide an average value of the third sampling current during one power switching cycle.

10. An output current sensing circuit applied in a buck-boost converter, wherein the buck-boost converter has a first power switch, a second power switch, a third power switch and a fourth power switch, and the buck-boost converter operates in a buck mode with a buck power switching cycle, a boost mode with a boost power switching cycle or a buck-boost mode with a buck-boost power switching cycle, the output current sensing circuit comprising:
a first sampling circuit, configured to provide a first sampling current representing a current flowing through the first power switch;
a second sampling circuit, configured to provide a second sampling current representing a current flowing through the fourth power switch; and
a current processing circuit, configured to generate a third sampling current based on the first sampling current and the second sampling current, wherein the buck-boost power switching cycle consists of a first buck-boost phase, a second buck-boost phase and a third buck-boost phase, wherein during one buck-boost power switching cycle, each of the first buck-boost phase, the second buck-boost phase and the third buck-boost phase is not repeated, and wherein a time period corresponding to the complete buck-boost power switching cycle is the sum of a time period of the first buck-boost phase, a time period of the second buck-boost phase and a time period of the third buck-boost phase, and wherein the third sampling current equals to zero during the first buck-boost phase, equals to the first sampling current during the second buck-boost phase, and equals to the second sampling current during the third buck-boost phase.

11. The output current sensing circuit as claimed in claim 10, wherein the third sampling current equals to the second sampling current during the buck power switching cycle, and wherein the boost power switching cycle comprises a first boost phase and a second boost phase, and the third sampling current equals to zero during the first boost phase and equals to the first sampling current during the second boost phase.

12. The output current sensing circuit as claimed in claim 11, wherein the first buck-boost phase is a phase in the buck-boost mode when the first power switch and the third power switch are on and the second power switch and the fourth power switch are off, the second buck-boost phase is a phase in the buck-boost mode when the first power switch and the fourth power switch are on and the second power switch and the third power switch are off, the third buck-boost phase is a phase in the buck-boost mode when the second power switch and the fourth power switch are on and the first power switch and the third power switch are off, and wherein the first boost phase is a phase in the boost mode when the first power switch and the third power switch are on and the second power switch and the fourth power switch are off, and the second boost phase is a phase in the boost mode when the first power switch and the fourth power switch are on and the second power switch and the third power switch are off.

13. The output current sensing circuit as claimed in claim 10, wherein the first power switch and the second power switch are coupled in series between an input terminal and a reference ground and form a first common node, and the third power switch and the fourth power switch are coupled in series between an output terminal and the reference ground and form a second common node, and wherein the buck-boost converter further comprises an inductor coupled between the first common node and the second common node.

14. The output current sensing circuit as claimed in claim 10,
wherein the first sampling circuit comprises:
a first transistor having a source, a drain and a gate, wherein the drain of the first transistor is coupled to a drain of the first power switch, and the gate of the first transistor is configured to receive a first driving signal for driving the first power switch;
a first sampling resistor having a first terminal and a second terminal, wherein the first terminal of the first sampling resistor is coupled to the source of the first transistor, and the second terminal of the first sampling resistor is coupled to a source of the first power switch; and a first amplifying circuit configured to amplify a voltage across the first sampling resistor and to generate the first sampling current; and wherein the second sampling circuit comprises:

a second transistor having a source, a drain and a gate, wherein the drain of the second transistor is coupled to a drain of the second power switch, and the gate of the second transistor is configured to receive a second driving signal for driving the second power switch;

a second sampling resistor having a first terminal and a second terminal, wherein the first terminal of the second sampling resistor is coupled to the source of the second transistor, and the second terminal of the second sampling resistor is coupled to a source of the second power switch; and a second amplifying circuit configured to amplify a voltage across the second sampling resistor and to generate the second sampling current.

15. The output current sensing circuit as claimed in claim 10, wherein the current processing circuit comprises:

a mode selection circuit, configured to generate a buck mode enable signal, a boost mode enable signal and a buck-boost mode enable signal based on an input voltage and an output voltage of the buck-boost converter;

an enable signal generating circuit, configured to generate a first enable signal and a second enable signal based on a second driving signal for driving the second power switch and a third driving signal for driving the third power switch;

a third transistor, having a first terminal, a second terminal and a third terminal, wherein the second terminal of the third transistor is configured to receive the first sampling current, and the third terminal of the third transistor is configured to receive the boost mode enable signal;

a fourth transistor, having a first terminal, a second terminal and a third terminal, wherein the second terminal of the fourth transistor is coupled to the first terminal of the third transistor, and the third terminal of the fourth transistor is configured to receive a fourth driving signal for driving the fourth power switch;

a fifth transistor, having a first terminal, a second terminal and a third terminal, wherein the second terminal of the fifth transistor is configured to receive the first sampling current, and the third terminal of the fifth transistor is configured to receive the buck-boost mode enable signal;

a sixth transistor, having a first terminal, a second terminal and a third terminal, wherein the second terminal of the sixth transistor is coupled to the first terminal of the fifth transistor, and the third terminal of the sixth transistor is configured to receive the first enable signal;

a seventh transistor, having a first terminal, a second terminal and a third terminal, wherein the second terminal of the seventh transistor is configured to receive the second sampling current, and the third terminal of the seventh transistor is configured to receive the buck mode enable signal;

an eighth transistor, having a first terminal, a second terminal and a third terminal, wherein the second terminal of the eighth transistor is configured to receive the second sampling current, and the third terminal of the eighth transistor is configured to receive the buck-boost mode enable signal; and a ninth transistor, having a first terminal, a second terminal and a third terminal, wherein the second terminal of the ninth transistor is coupled to the first terminal of the eighth transistor, and the third terminal of the ninth transistor is configured to receive the second enable signal, wherein the first terminal of the fourth transistor, the first terminal of the sixth transistor, the first terminal of the seventh transistor and the first terminal of the ninth transistor are coupled to a common point to provide the third sampling current.

16. The output current sensing circuit as claimed in claim 15, wherein the mode selection circuit comprises:

a buck comparator having a first input terminal configured to receive the input voltage, a second input terminal configured to receive the product of the output voltage and a first threshold, and an output terminal configured to provide the buck mode enable signal, wherein the first threshold is a constant higher than 1;

a boost comparator having a first input terminal configured to receive the input voltage, a second input terminal configured to receive the product of the output voltage and a second threshold, and an output terminal configured to provide the boost mode enable signal, wherein the second threshold is a constant less than 1 and higher than 0; and a NOR gate having a first input terminal configured to receive the buck mode enable signal, a second input terminal configured to receive the boost mode enable signal, and an output terminal to provide the buck-boost mode enable signal.

17. The output current sensing circuit as claimed in claim 15, wherein the enable signal generating circuit comprises:

a first RS trigger, having a set terminal, a reset terminal and an output terminal, wherein the set terminal is configured to receive a falling edge of the third driving signal, the reset terminal is configured to receive a rising edge of the second driving signal; and a second RS trigger, having a set terminal, a reset terminal and an output terminal, wherein the set terminal of the second RS trigger is configured to receive the rising edge of the second driving signal, and the reset terminal of the second RS trigger is configured to receive a rising edge of the third driving signal.

18. The output current sensing circuit as claimed in claim 15, further comprising:

a capacitor, coupled to the current processing circuit to receive the third sampling current; and an output resistor, coupled in parallel with the capacitor; wherein the capacitor and the output resistor are configured to provide an average value of the third sampling current during one power switching cycle.

19. An output current sensing method for sensing an output current information of a buck-boost converter, wherein the buck-boost converter has a first power switch, a second power switch, a third power switch and a fourth power switch, the buck-boost converter operates in a buck mode with a buck power switching cycle, a boost mode with a boost power switching cycle or a buck-boost mode with a buck-boost power switching cycle, the output current sensing method comprising:

generating a first sampling current representing a current flowing through the first power switch;

generating a second sampling current representing a current flowing through the fourth power switch;

generating a third sampling current based on the first sampling current and the second sampling current; and generating output current information based on the third sampling current;

wherein the buck-boost power switching cycle consists of a first buck-boost phase, a second buck-boost phase and a third buck-boost phase, wherein during one buck-boost power switching cycle, each of the first buck-boost phase, the second buck-boost phase and the third buck-boost phase is not repeated, and wherein a time period corresponding to the complete buck-boost power switching cycle is the sum of a time period of the first buck-boost phase, a time period of the second buck-boost phase and a time period of the third buck-boost phase, and the step of generating the third sampling current comprises sampling the first sampling current to generate the third sampling current during the second buck-boost phase and sampling the second sampling current to generate the third sampling current during the third buck-boost phase and the third sampling current equals to zero during the first buck-boost phase.

20. The output current sensing method as claimed in claim 19, wherein the third sampling current equals to zero during the first buck-boost phase, equals to the first sampling current during the second buck-boost phase, and equals to the second sampling current during the third buck-boost phase, the third sampling current equals to the second sampling current during the buck power switching cycle, and the boost power switching cycle comprises a first boost phase and a second boost phase, and the third sampling current equals to zero during the first boost phase and equals to the first sampling current during the second boost phase.

* * * * *